United States Patent
Lien et al.

(10) Patent No.: US 10,636,498 B1
(45) Date of Patent: Apr. 28, 2020

(54) MANAGING BIT-LINE SETTLING TIME IN NON-VOLATILE MEMORY

(71) Applicant: SanDisk Technologies LLC, Addison, TX (US)

(72) Inventors: Yu-Chung Lien, San Jose, CA (US); Xiang Yang, Santa Clara, CA (US); Zhenming Zhou, San Jose, CA (US); Deepanshu Dutta, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/283,441

(22) Filed: Feb. 22, 2019

(51) Int. Cl.
| | |
|---|---|
| *G11C 16/32* | (2006.01) |
| *G11C 16/04* | (2006.01) |
| *G11C 16/10* | (2006.01) |
| *G11C 16/34* | (2006.01) |
| *G11C 16/26* | (2006.01) |
| *H01L 27/11565* | (2017.01) |
| *H01L 27/11582* | (2017.01) |
| *G11C 11/56* | (2006.01) |

(52) U.S. Cl.
CPC .......... *G11C 16/32* (2013.01); *G11C 16/0483* (2013.01); *G11C 16/10* (2013.01); *G11C 16/26* (2013.01); *G11C 16/3459* (2013.01); *G11C 11/5671* (2013.01); *G11C 2211/5621* (2013.01); *G11C 2216/14* (2013.01); *H01L 27/11565* (2013.01); *H01L 27/11582* (2013.01)

(58) Field of Classification Search
CPC ..... G11C 16/32; G11C 16/0483; G11C 16/26; G11C 16/3459; G11C 16/10; G11C 2216/14; G11C 2211/5621; G11C 11/5671; H01L 27/11582; H01L 27/11565
See application file for complete search history.

(56) References Cited

U.S. PATENT DOCUMENTS

| | | | |
|---|---|---|---|
| 6,243,390 B1 * | 6/2001 | Smith, Jr. .......... | H04Q 11/0457 370/437 |
| 7,082,069 B2 | 7/2006 | Chou et al. | |
| 7,218,552 B1 | 5/2007 | Wan et al. | |
| 7,535,769 B2 | 5/2009 | Cernea | |
| 7,548,457 B2 * | 6/2009 | Kang ................ | G11C 11/5628 365/185.03 |
| 9,058,881 B1 | 6/2015 | Dusija et al. | |
| 9,524,781 B2 * | 12/2016 | Kim ................... | G11C 11/5628 |
| 9,633,742 B2 | 4/2017 | Desai et al. | |
| 9,865,352 B2 | 1/2018 | Miao et al. | |
| 10,157,680 B2 | 12/2018 | Yang et al. | |
| 2004/0057318 A1 | 3/2004 | Cernea et al. | |

(Continued)

OTHER PUBLICATIONS

U.S. Appl. No. 15/955,156, filed Apr. 17, 2018 by Shukla et al.

*Primary Examiner* — Gene N Auduong
(74) *Attorney, Agent, or Firm* — Vierra Magen Marcus LLP

(57) ABSTRACT

A non-volatile memory system comprises a plurality of word lines, a plurality of bit lines, non-volatile memory cells, and a sensing circuit. The sensing circuit is configured to sense a first set of the memory cells coupled to a contiguous set of the bit lines and a selected word line using a first bit line settling time. The sensing circuit is configured to sense a second set of the memory cells coupled to a non-contiguous set of the bit lines and the selected word line using a second bit line settling time.

20 Claims, 22 Drawing Sheets

(56) References Cited

U.S. PATENT DOCUMENTS

| | | | |
|---|---|---|---|
| 2015/0221351 A1* | 8/2015 | Park | G11C 8/08 365/51 |
| 2016/0254047 A1* | 9/2016 | Sun | G11C 11/5628 365/185.03 |
| 2016/0343419 A1* | 11/2016 | Park | G11C 8/08 |
| 2017/0178736 A1 | 6/2017 | Yang et al. | |

* cited by examiner

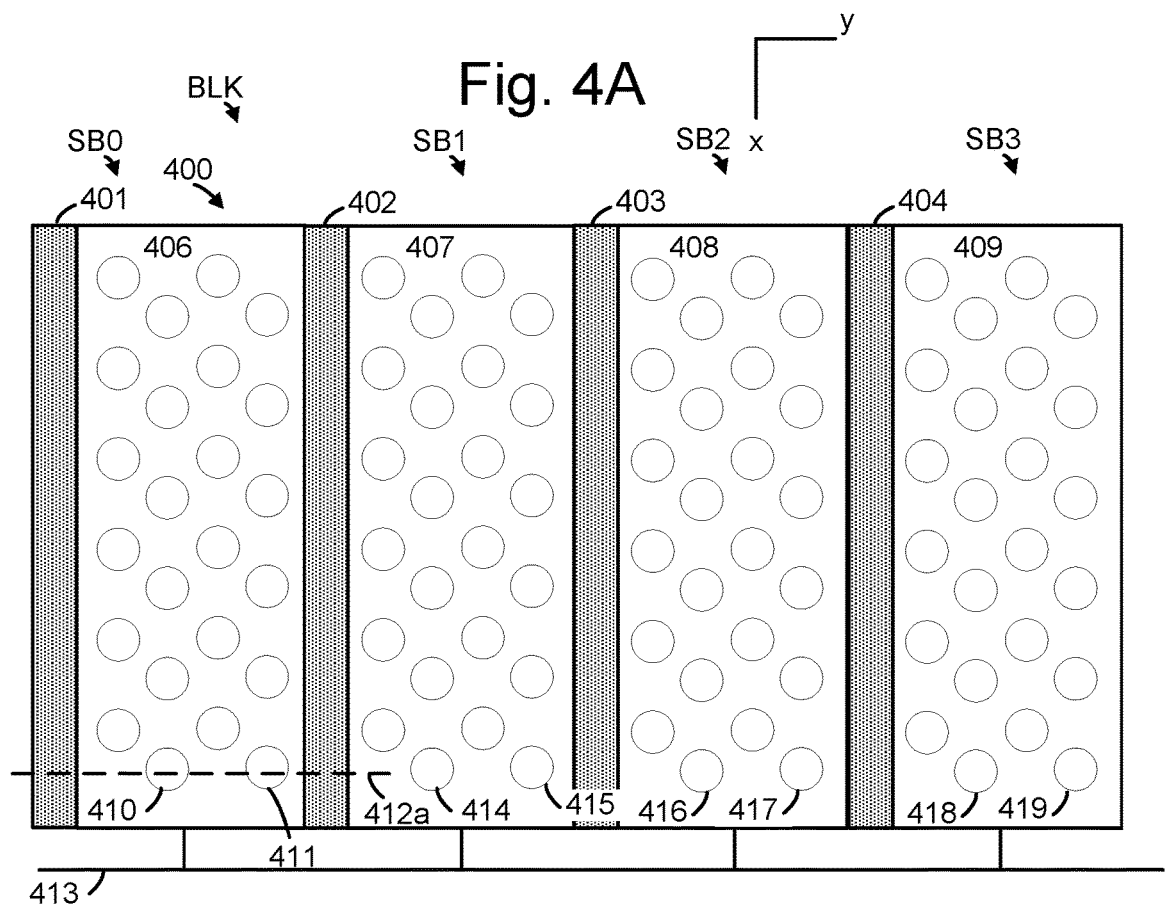
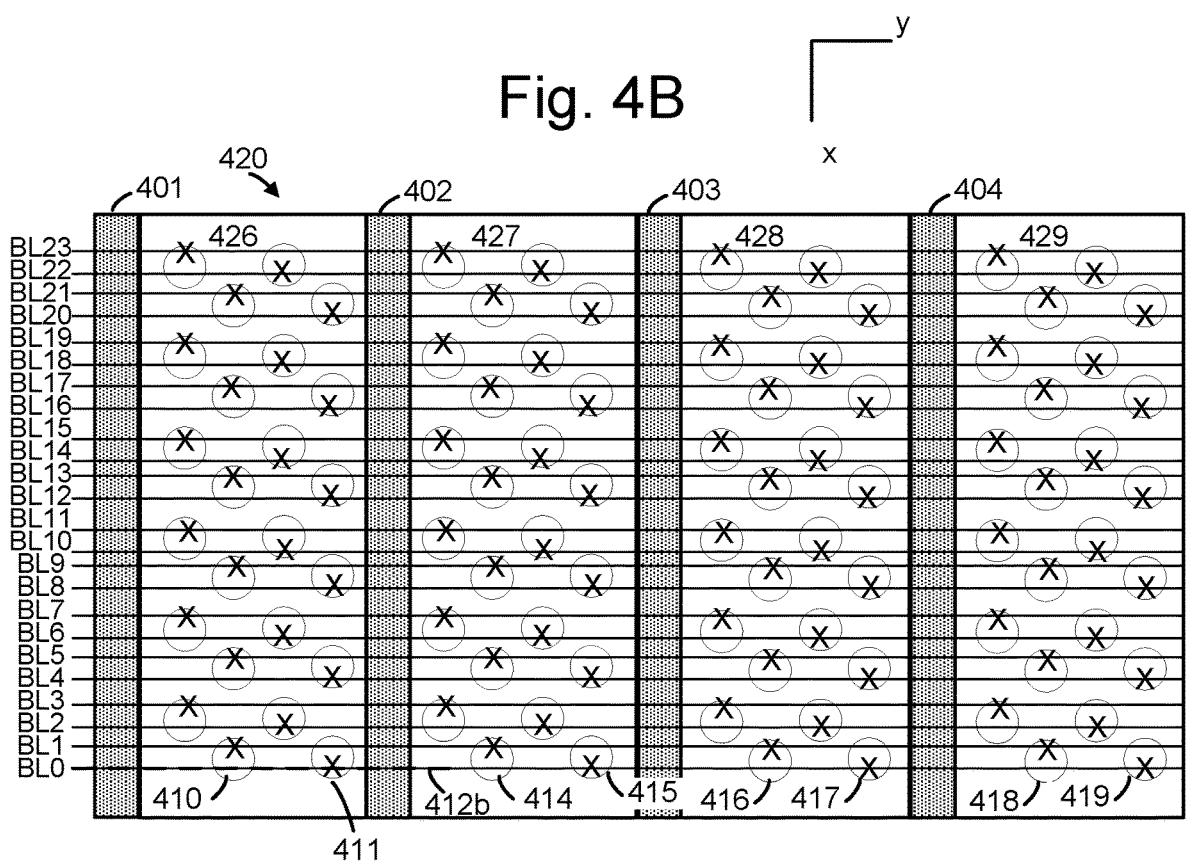

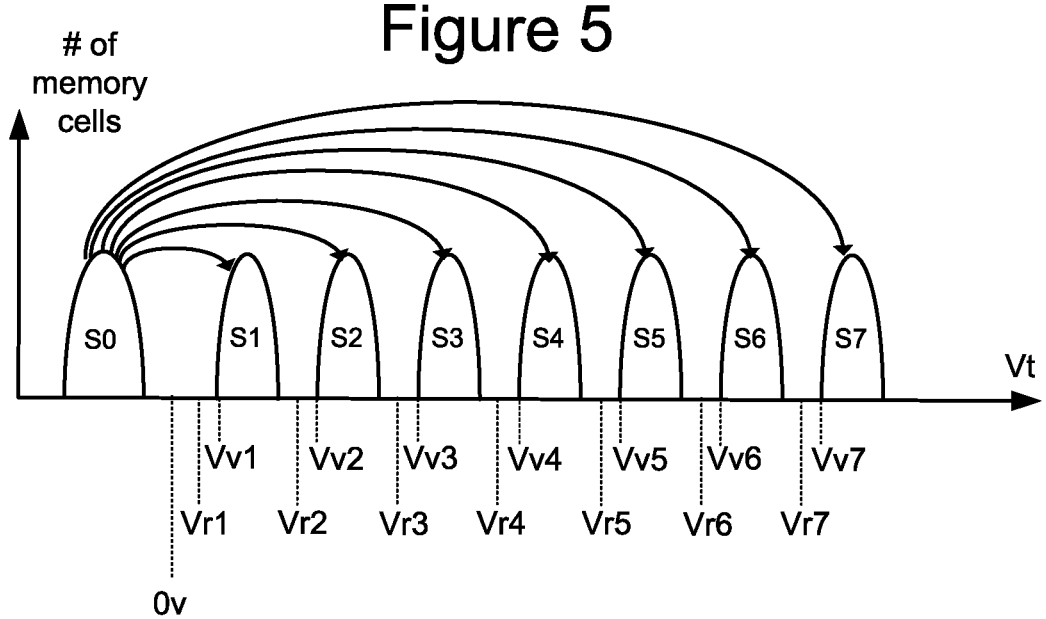
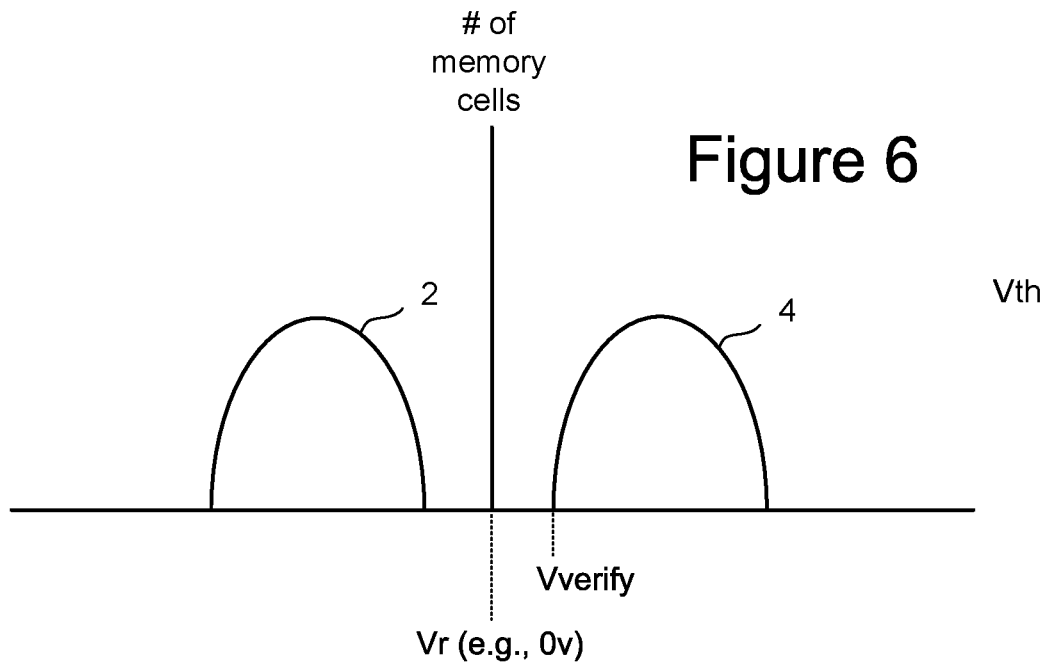

1600

| | WL ≤ n | | WL > n | |
|---|---|---|---|---|
| | 1st or 2nd PP | 3rd or 4th PP | 1st or 2nd PP | 3rd or 4th PP |
| SB0 | A | A | A | B |
| SB1 | A | A | A | C |
| SB2 | A | A | A | D |
| SB3 | A | A | A | E |

| | WL ≤ m | | WL > m | |
|---|---|---|---|---|
| | 1st PP | 2nd PP | 1st PP | 2nd PP |
| SB0 | E | E | E | F |
| SB1 | E | E | E | G |
| SB2 | E | E | E | G |
| SB3 | E | E | E | H |

MANAGING BIT-LINE SETTLING TIME IN NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 4A depicts a top view of an example word line layer of a 3D memory structure.

FIG. 4B depicts a top view of an example SGD layer 420, consistent with FIG. 4A.

FIG. 5 depicts threshold voltage distributions.

FIG. 6 depicts example threshold voltage distributions when the memory cells store one bit of data per memory cell.

FIG. 16A is a table that illustrates how bit line settling times can be managed based on several factors during one embodiment of a 4PPP mode.

FIG. 16B is a table that illustrates how bit line settling times can be managed based on several factors during one embodiment of a 2PPP mode.

DETAILED DESCRIPTION

Figure 1A:
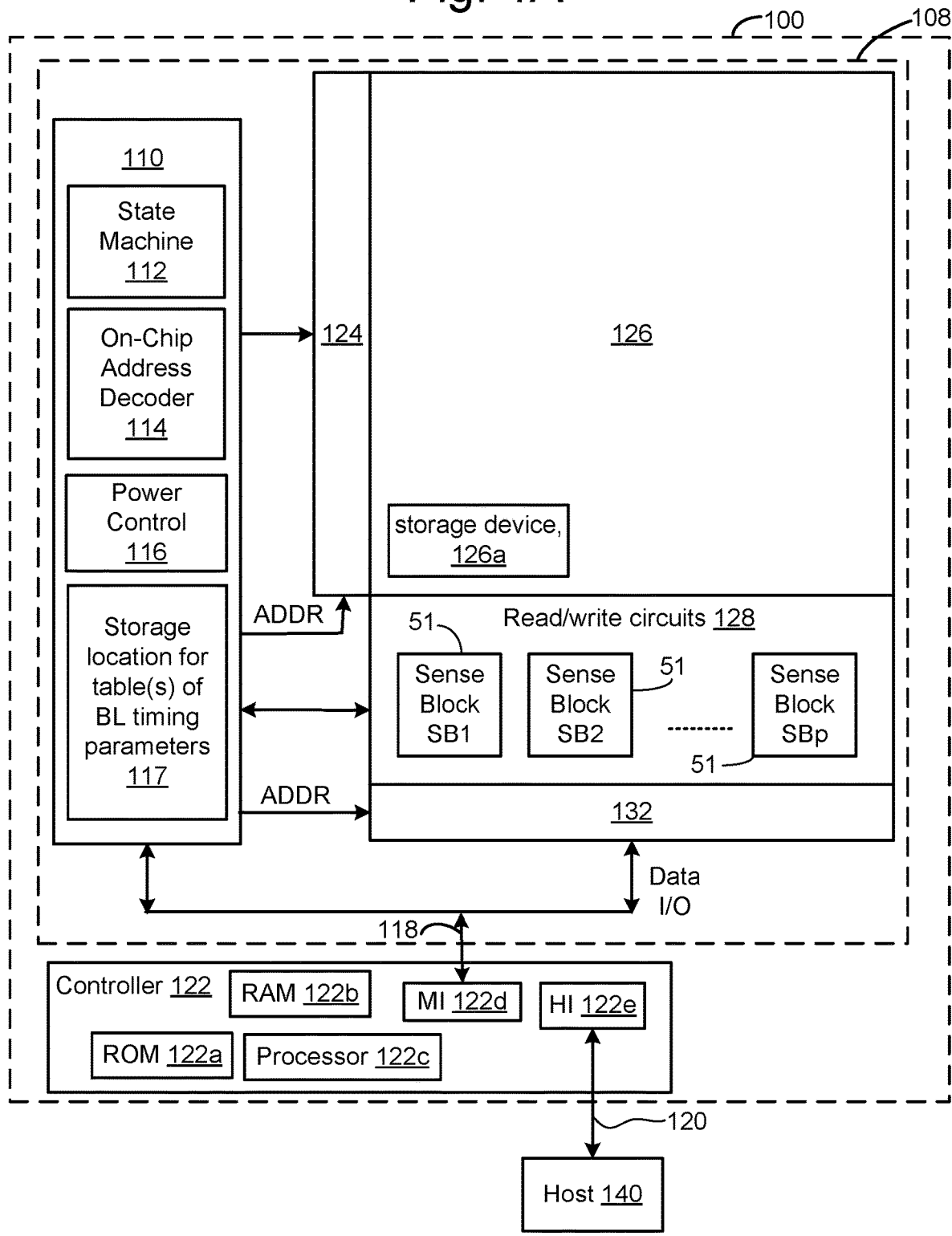
FIG. 1A is a functional block diagram of a memory system.

Technology is described herein for managing a bit line settling time during sensing operations in non-volatile memory. The bit line settling time is the length of time between applying a voltage to a bit line and sensing a condition of a memory cell coupled to the bit line, in one embodiment. The sensing operation is a program verify, in one embodiment. The sensing operation is a read operation, in one embodiment. The bit lines may extend parallel to each other. The bit lines have a physical sequence and can be numbered sequentially based on their physical locations. Capacitive coupling between the bit lines may impact the voltages applied to the bit lines. For example, capacitive coupling may slow the time it takes for the voltage on a bit line to stabilize at a target voltage. Managing the bit line settling time improves accuracy of the sensing operation. Managing the bit line settling time during a program verify helps the program operation complete with fewer program loops, in one embodiment.

A group of memory cells that are coupled to a respective group of bit lines are sensed together, in some embodiments. In some cases, the group of bit lines may be a contiguous set of bit lines. As defined herein, a contiguous set of bit lines contains all of the bit lines in a physical sequence of parallel bit lines. In some cases, the group of bit lines may be a non-contiguous set of bit lines. As defined herein, a non-contiguous set of bit lines is a set of parallel bit lines having no two members that are adjacent to each other. In one embodiment, a non-contiguous set bit lines contains alternating bit lines in a group of bit lines that extend parallel to each other. In one embodiment, a first bit line settling time is used when the set of the memory cells being sensed is coupled to a contiguous set of bit lines, and a second bit line settling time is used when the set of the memory cells being sensed is coupled to a non-contiguous set of bit lines. The second bit line settling time is longer than the first bit line settling time, in one embodiment. Using the longer settling time when the memory cells being sensed are coupled to the non-contiguous set of bit lines improves sensing accuracy.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state (also referred to as S0) and three higher data states referred to as either the A, B and C data states (also referred to as S1, S2, and S3). In a three-bit per cell memory device, there are eight data states including the erased state (S0) and seven higher data states referred to as the A-G data states (also referred to as S1, S2, S3, S4, S5, S6, and S7). In a four-bit per cell memory device, there are sixteen data states including the erased state (S0) and fifteen higher data states, S0-S15.

A program operation may use a set of increasing program voltages or pulses which are applied to the word line (referred to as the "selected word line") in respective program loops or program-verify iterations in one or more program passes. Verify tests may be performed after at least some of the program voltages to determine whether the memory cells have completed programming (or reached a checkpoint). A verify test can involve applying a verify voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vt of the memory cell exceeds the control gate voltage and the memory cell has reached the assigned data state. Programming is thus completed for the memory cell, and it can be locked out from further programming while programming continues for other memory cells in subsequent program loops.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vt of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

In some embodiments, to increase performance a die of the memory system stores one bit of data per memory cell and will allow partial page writing and reading. In one embodiment, a page of data includes all memory cells connected to a word line, and partial page writing/reading only operates on a subset of memory cells connected to the selected word line. That is, a partial page is a subset of a page. The partial page can be 25% of the page, 50% of the page, or another percentage or fraction of the page. In some embodiments, partial page SLC programming should complete in fewer program loops than are permitted for MLC programming. However, partial page programming may be used to program a set of memory cells that are coupled to a non-contiguous set of bit lines. For example, partial page programming can be used to program a set of memory cells that are coupled to a set of alternating bit lines. In some embodiments, the bit line settling time is managed during SLC partial page programming to help the partial page program operation complete in fewer program loops.

In some embodiments, the length of the bit line settling time depends on a programming mode. Programming modes include a full page programming mode and one or more partial page programming modes, in one embodiment. A longer bit line settling time is used during program verify of a partial page programming operation than during a full page programming operation, in one embodiment. The longer bit line settling time helps the partial page programming operation to complete in fewer program loops.

The bit line settling time can be managed based on many other factors. In one embodiment, the bit line settling time during a sensing operation depends on the location of the selected word line within a set of word lines. In one embodiment, the bit line settling time during a program verify operation depends on when the selected word line is programmed in a sequence that programs a set of word lines.

FIGS. 1A-4C describe examples of a memory system that can be used to implement the technology proposed herein. FIG. 1A is a functional block diagram of an example memory system 100. The components depicted in FIG. 1A can be electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The row decoder 124 can include the drivers and other elements to bias the word lines for the different memory operations. The read/write circuits 128 include multiple sense blocks 51 including SB1, SB2, SBp (sensing circuitry) and allow a page of memory cells to be read or programmed in parallel, where a page is the unit in which data is written and/or read. A physical page is the physical unit of a number of cells into which data can be concurrently written and/or read, and a logical page a corresponding logical unit of data written into a physical page.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase and others) on memory structure 126, and includes a state machine 112, an on-chip address decoder 114, and a power control circuit 116. The state machine 112 provides die-level control of memory operations. In one embodiment, state machine 112 is programmable by software. In other embodiments, state machine 112 does not use software and is completely implemented in hardware (e.g., electrical circuits). In one embodiment, control circuitry 110 includes buffers such as registers, ROM fuses and other storage devices for storing default values such as base voltages and other parameters. In one embodiment the table(s) of bit line (BL) timing parameters 117 is used to store timing of a bit line parameter for a sensing operation. The sensing operation is a program verify, in one embodiment. The sensing operation is a read operation, in one embodiment. The timing parameter is a bit line settling time, in one embodiment.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1A, can be considered one or more control circuits that perform the functions described herein. The one or more control circuits can include hardware only or a combination of hardware and software (including firmware). For example, a controller programmed by firmware to perform the functions described herein is one example of a control circuit. One or more control circuits can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive memories (e.g., ReRAM), conductive bridge memories (e.g., CBRAM), magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage, light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

Figure 1B:
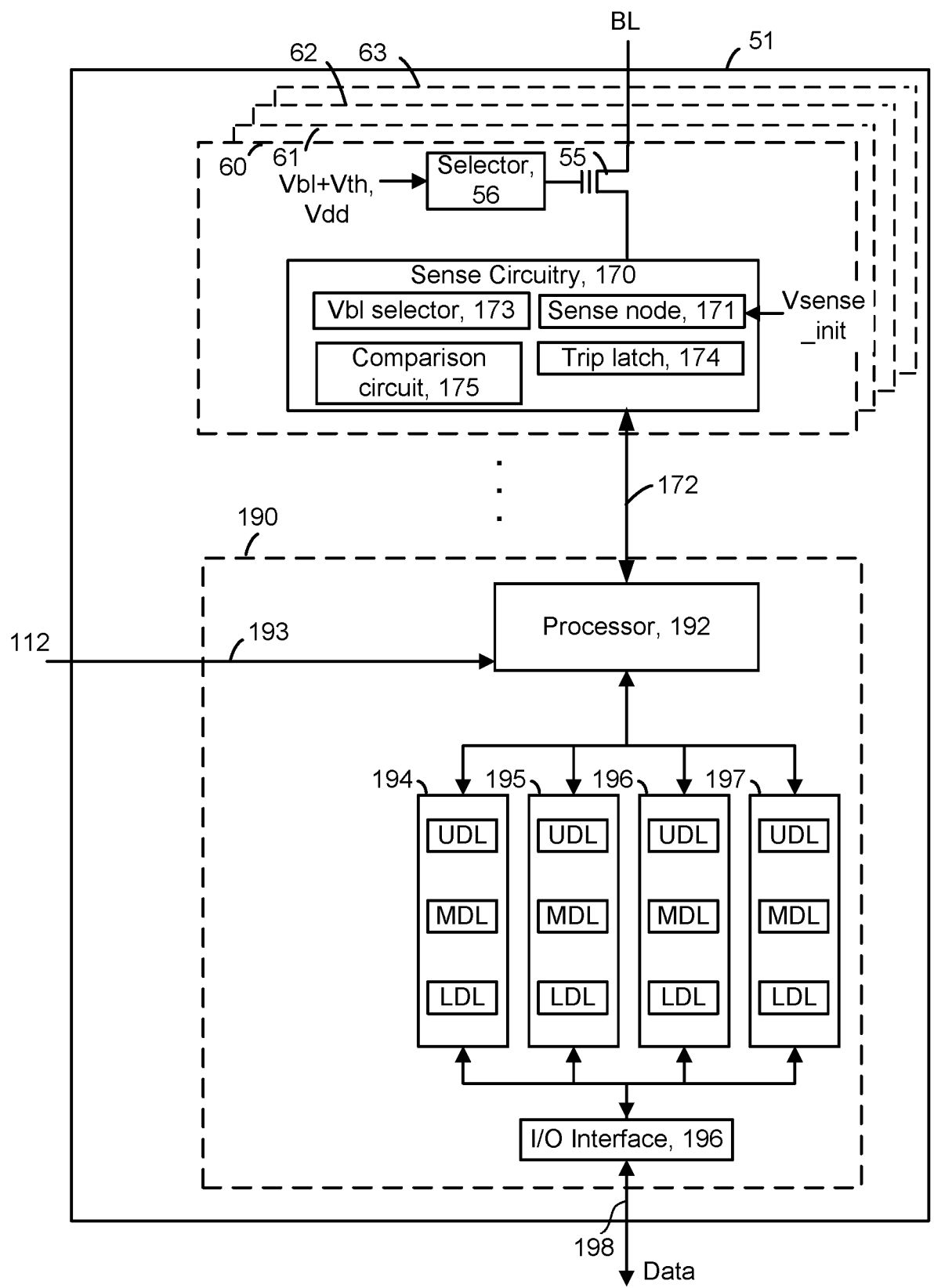
FIG. 1B is a block diagram depicting one embodiment of the sense block 51 of FIG. 1A

FIG. 1B is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program enable voltage (e.g., V_pgm_enable) or a program-inhibit voltage (e.g., Vbl_inh) to a bit line connected to a memory cell. During the application of a sensing operation (e.g., read, verify), the Vbl selector 173 can pass a voltage that enables sensing of the memory cell.

A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vt (e.g., 1 V). For example, if Vbl+Vt is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 198. One set of data latches, e.g., comprising individual latches LDL, MDL and UDL, can be provided for each sense circuit. In some cases, additional data latches may be used. LDL stores a bit for a lower page of data, MDL stores a bit for a middle page of data, and UDL stores a bit for an upper page of data. This is in an eight-level or three-bits per memory cell memory device.

The processor 192 performs logic operations and/or computations, such as to determine the data stored in the sensed memory cell and store the determined data in the set of data latches. Each set of data latches 194-197 is used to store data bits determined by processor 192 during a read operation, and to store data bits imported from the data bus 198 during a program operation which represent write data meant to be programmed into the memory. I/O interface 196 provides an interface between data latches 194-197 and the data bus 198.

The processor 192 may also be used to determine what voltage to apply to the bit line, based on the state of the latches. This may be used to manage the magnitude and/or length of time that a weak program enable voltage is applied to the bit line.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 198, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 198, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 2:
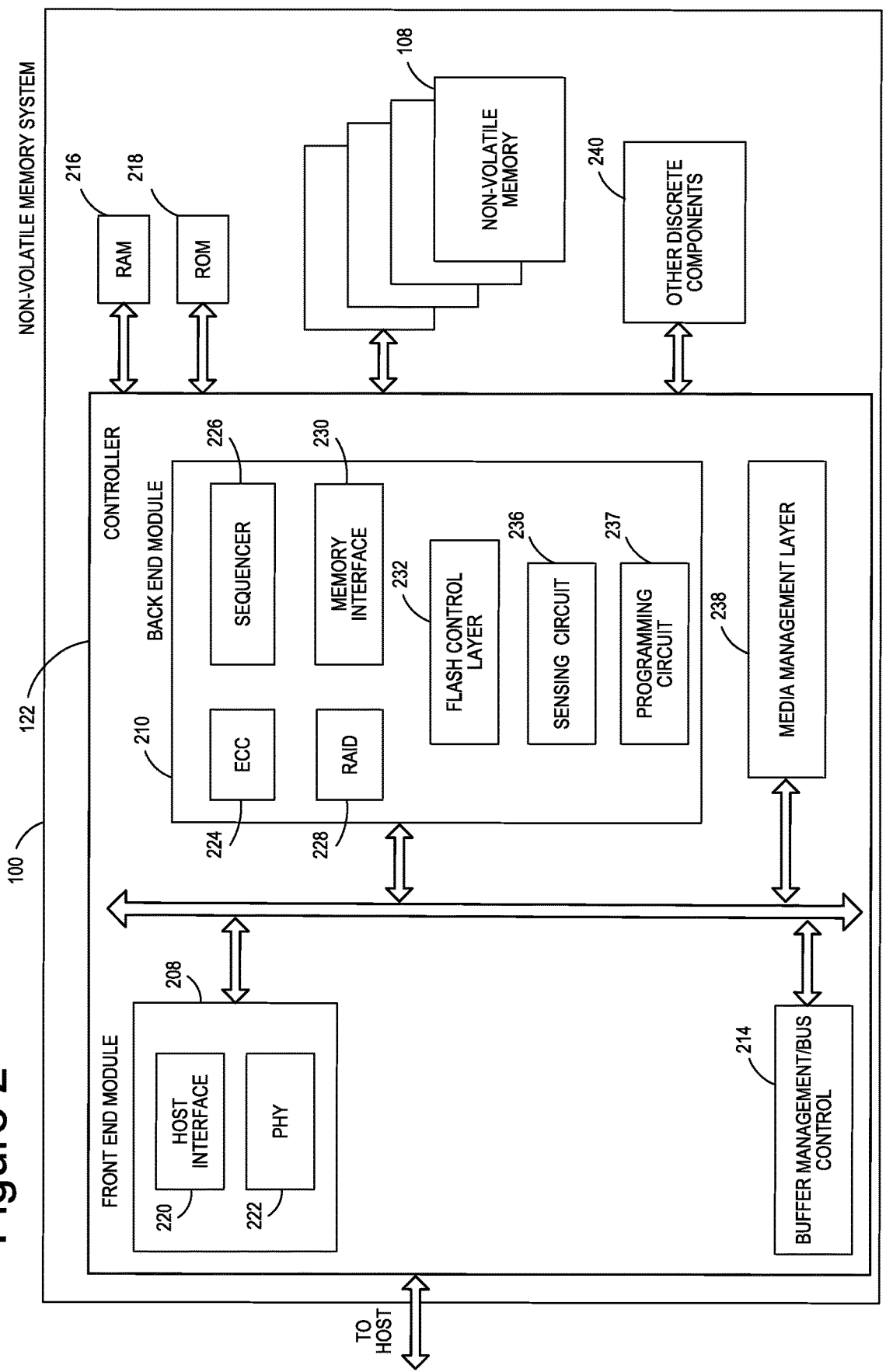
FIG. 2 is a block diagram depicting one embodiment of a memory system, depicting more details of one embodiment of controller 122.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

The memory cells on a memory die 108 can be arranged in one or more planes. In one embodiment, memory operations are performed in parallel on groups of memory cells on different planes on the same memory die. In one embodiment, threshold voltage maintenance of non-data transistors (e.g., select transistors and/or dummy memory cell transistors) is performed in parallel on different planes on the same memory die. In one embodiment, memory operations are performed in parallel on groups of memory cells on different memory die 108. In one embodiment, threshold voltage maintenance of non-data transistors (e.g., select transistors and/or dummy memory cell transistors) is performed in parallel on different memory die.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 1A (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 108 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230, which is configured to be connected to non-volatile memory 108, provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

The sensing circuit 236 is configured to control sensing of memory cells in non-volatile memory 108. The sensing circuit 236 manages a bit line settling time during sensing operations, in one embodiment. The sensing circuit 236 may be configured to implement any of processes shown and described with respect to FIGS. 7A, 7B, 8, 10, 11, 12, 13, 14, and/or 15.

The programming circuit 237 is configured to control programming of memory cells in non-volatile memory 108. The programming circuit 237 manages the order in which word lines are programmed, in one embodiment.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

One or more of ECC 224, sequencer 226, RAID 228, flash control layer 232, media management layer 238, and/or buffer management/bus control 214 may be referred to as a processor circuit. The processor circuit can include hardware only or a combination of hardware and software (including firmware). For example, a controller programmed by firmware to perform the functions described herein is one example of a control circuit. A processor circuit can include a processor, PGA (Programmable Gate Array, FPGA (Field Programmable Gate Array), ASIC (Application Specific Integrated Circuit), integrated circuit or other type of circuit.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3A:
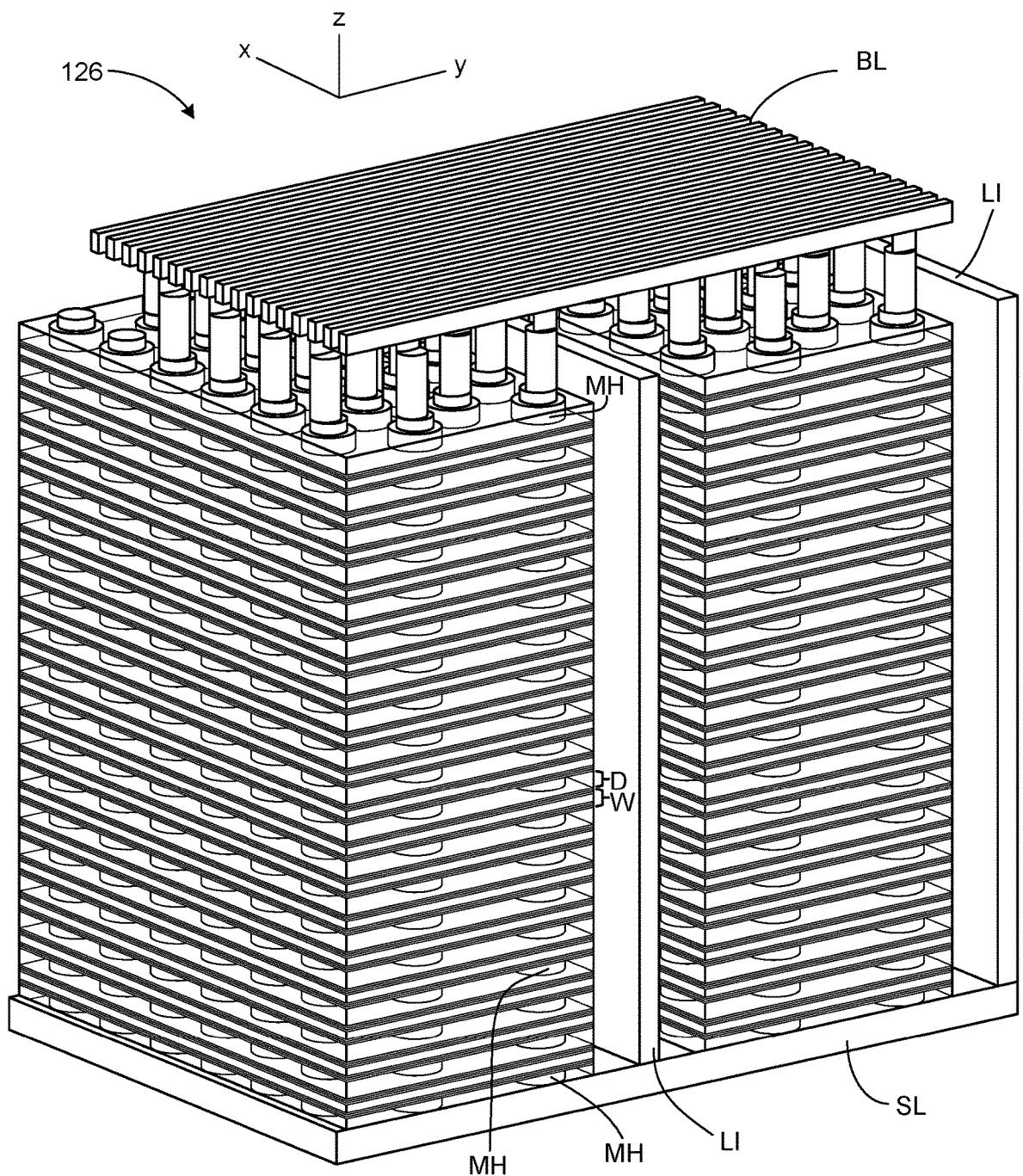
FIG. 3A is a perspective view of a portion of one embodiment of a monolithic three-dimensional memory structure.

FIG. 3A is a perspective view of a portion of one example embodiment of a monolithic three-dimensional memory structure 126, which includes a plurality memory cells. For example, FIG. 3A shows a portion of one block of memory. The structure depicted includes a set of bit lines BL positioned above a stack of alternating dielectric layers and conductive layers. The bit lines extend parallel to each other in a y-direction. The bit lines are formed of a conductive material such as tungsten. There may be a dielectric material between adjacent bit lines such as air or silicon oxide. During operation, capacitive coupling between the bit lines may impact the ability to charge selected bit lines to target voltages. The capacitive coupling may increase the time it takes between first applying a target voltage to one end of the bit line and the bit line voltage stabilizing at the target voltage. This may be especially true when the selected bit lines contain a non-contiguous set of the bit lines, such as alternating bit lines. As the size of memory devices continues to scale down the distance between the bit lines may decrease, which can exacerbate the capacitive coupling issue. Embodiments disclosed herein manage a bit line settling time during a sensing operation to address issues in capacitive coupling between the bit lines. For example, managing a bit line settling time may address capacitive coupling between a selected bit line and an adjacent unselected bit line.

For example, purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3A only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3A, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided with respect to FIG. 3B.

Figure 3B:
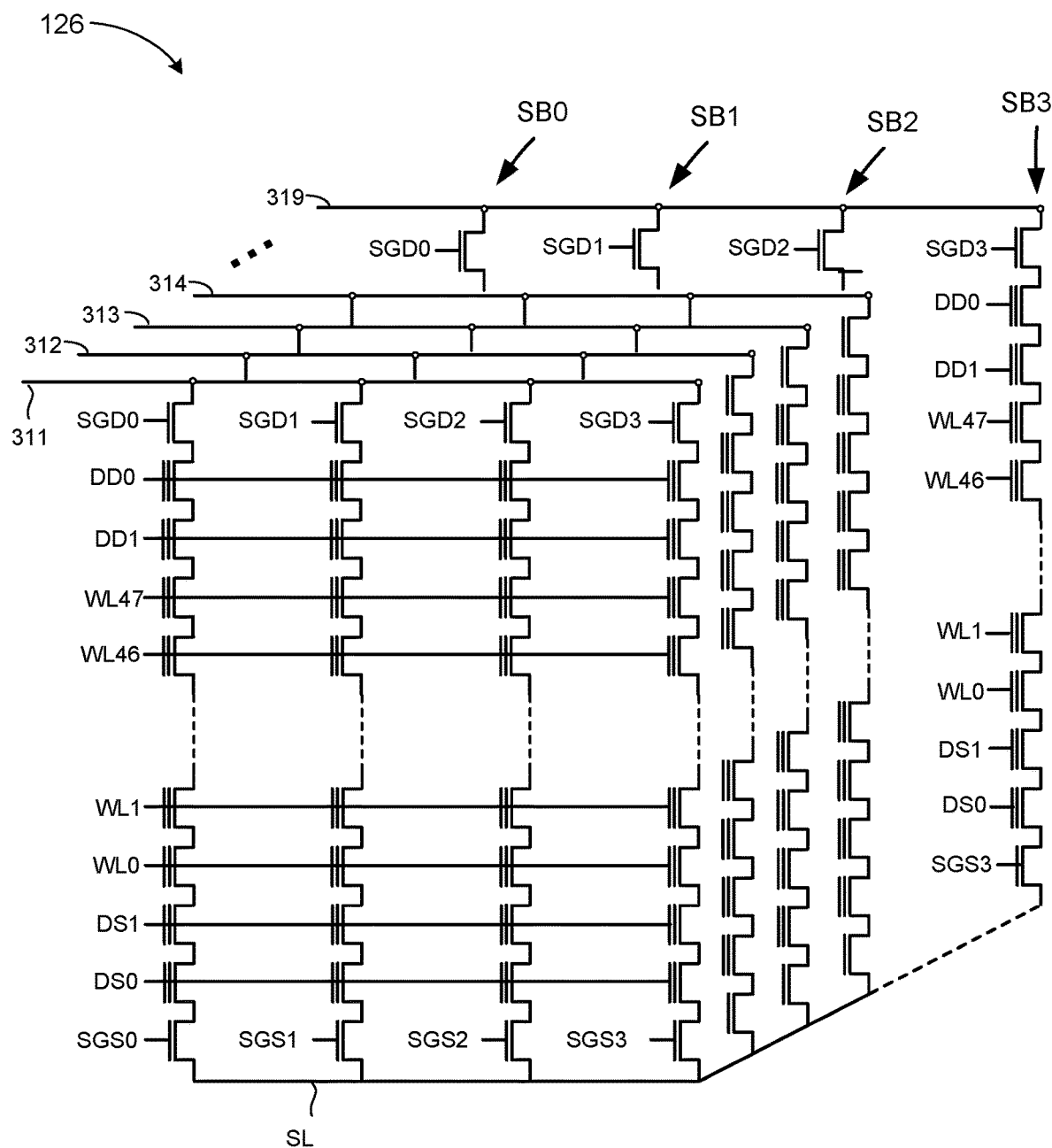
FIG. 3B depicts an example 3D NAND structure.

FIG. 3B depicts an example 3D NAND structure and shows physical word lines WLL0-WLL47 running across the entire block. The structure of FIG. 3B includes bit lines 311, 312, 313, 314, . . . , 319. Within the block, each bit line is connected to four NAND strings. Drain side selection lines SGD0, SGD1, SGD2 and SGD3 are used to determine which of the four NAND strings connect to the associated bit line. The block can also be thought of as being divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

FIG. 4A depicts a top view of an example word line layer 400 of a 3D memory structure, in one embodiment. A 3D memory device can comprise a stack of alternating conductive and dielectric layers. Herein, the layers may be referred to as horizontal layers, due to their orientation with respect to the x-y surface of the substrate. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

FIG. 4A and other Figures are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412a. The region 407 has example memory holes 414 and 415. The region 408 has example memory holes 416 and 417. The region 409 has example memory holes 418 and 419.

Each circle represents the cross-section of a memory hole at a word line layer or SG layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. Note that there is an insulating material (not depicted in FIG. 4A) between the metal-filled slits 401, 402, 403, 404 and the adjacent region 406-409 of the word line layer.

FIG. 4B depicts a top view of an example SGD layer 420, consistent with FIG. 4A. The SGD layer is divided into regions 426, 427, 428 and 429. Each region can be connected to a different voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412b which is coincident with a bit line BL0. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the x-direction. In practice many more bit lines can be used for SGD layer 420.

Different subsets of bit lines are connected to cells in different rows. For example, BL0, BL4, BL8, BL12, BL16 and BL20 are connected to cells in a first row of cells at the right-hand edge of each region. BL2, BL6, BL10, BL14, BL18 and BL22 are connected to cells in an adjacent row of cells, adjacent to the first row at the right-hand edge. BL3, BL7, BL11, BL15, BL19 and BL23 are connected to cells in a first row of cells at the left-hand edge of each region. BL1, BL5, BL9, BL13, BL17 and BL21 are connected to cells in an adjacent row of cells, adjacent to the first row at the left-hand edge.

Figure 4C:
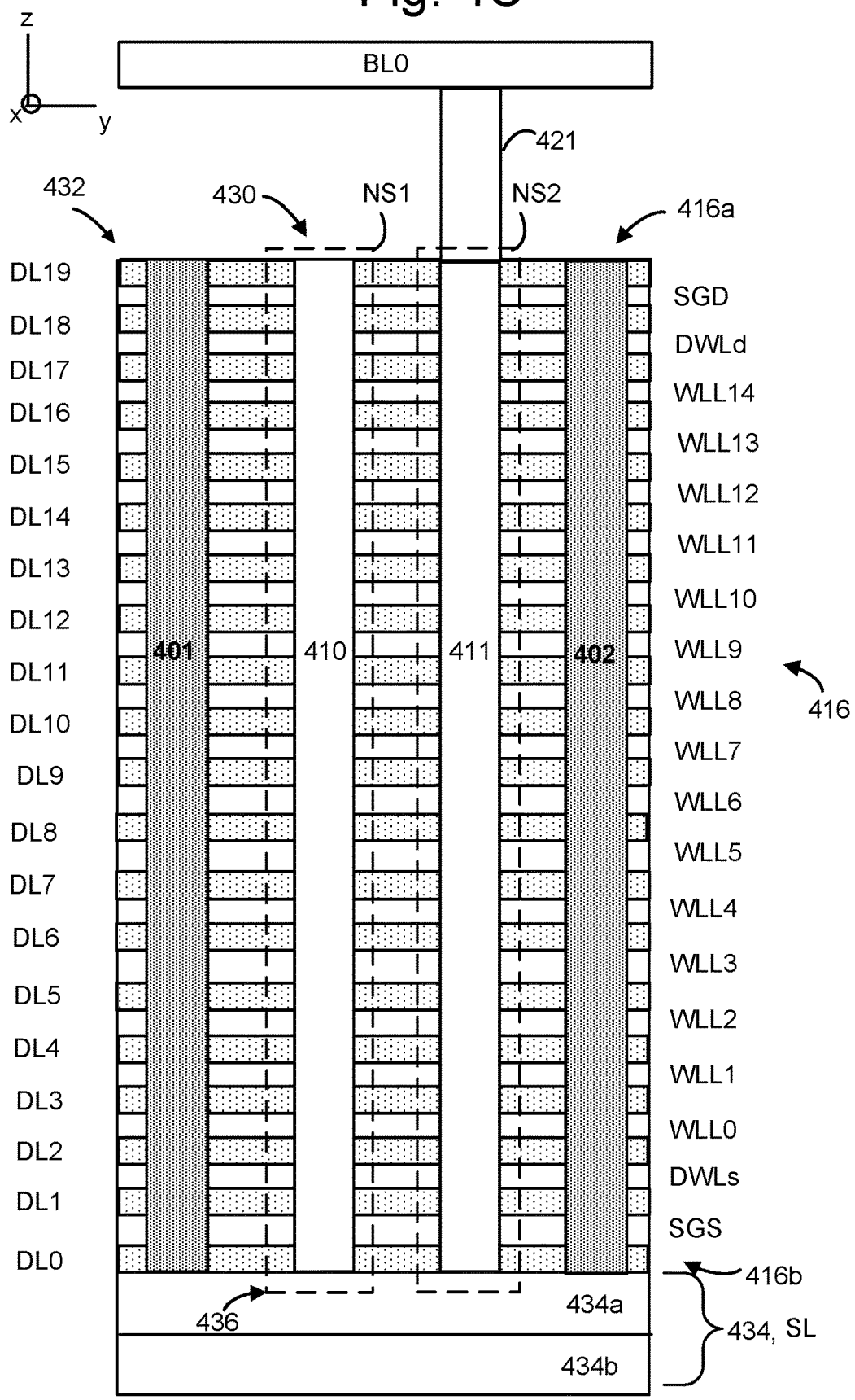
FIG. 4C depicts an example cross-sectional view of a portion of the block of FIG. 4A.

FIG. 4C depicts an example cross-sectional view of a portion of the block of FIG. 4A. The block comprises a stack 432 of alternating conductive and dielectric layers. In this example, the conductive layers comprise SGD layer, SGS layers, dummy word line layers (or word lines) DWLd, DWLs, in addition to data word line layers (or word lines) WLL0-WLL14. The dielectric layers are labelled as DL0-DL19. Further, regions of the stack which comprise NAND strings NS1 and NS2 are depicted. Each NAND string encompasses a memory hole 410 or 411 which is filled with materials which form memory cells adjacent to the word lines. Note that there may be more or fewer SGD layers, SGS layers, dummy word line layers, and data word line layers.

Underneath the stack is a source line (SL) 434. In one approach, a portion of the source line SL comprises a polysilicon layer 434a which is in contact with a source end of each string of memory cells in a block. The polysilicon layer 434a is in electrical contact with the NAND string channel (not shown in FIG. 4C). The polysilicon layer 434a is in contact with a metal 434b (e.g., tungsten) layer. The source line 434 may be shared by all of the blocks in a plane, in one approach.

NS1 has a source-end 436 at a bottom 416b of the stack 432 and a drain-end 430 at a top 416a of the stack. Metal-filled slits 401, 402 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 421 connects the drain-end 430 to BL0.

In some embodiments, the order of programming is from the word line closest to the source line to the word line closest to the bit line. For example, the memory cells at layer WLL0 in the block are programmed, then the memory cells at layer WLL1 in the block are programmed, then the memory cells at layer WLL2 in the block are programmed, etc. In one embodiment, the source line to bit line order is used for full page programming, but the programming order is reversed for partial page programming. For example, for one embodiment of partial page programming the memory cells at layer WLL14 in the block are programmed, then the memory cells at layer WLL13 in the block are programmed, then the memory cells at layer WLL12 in the block are programmed, etc.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

With reference again to FIG. 4A, the memory cells in the word line layer 400 in each the sub-blocks (SB0, SB1, SB2, SB3) constitutes a page of memory cells, in one embodiment. If each of the memory cells stores two bits, then two pages may be stored in each sub-block in the word line layer 400. If each of the memory cells stores three bits, then three pages may be stored in each sub-block in the word line layer 400. In some embodiments, "partial pages" are programmed.

Figure 4D:
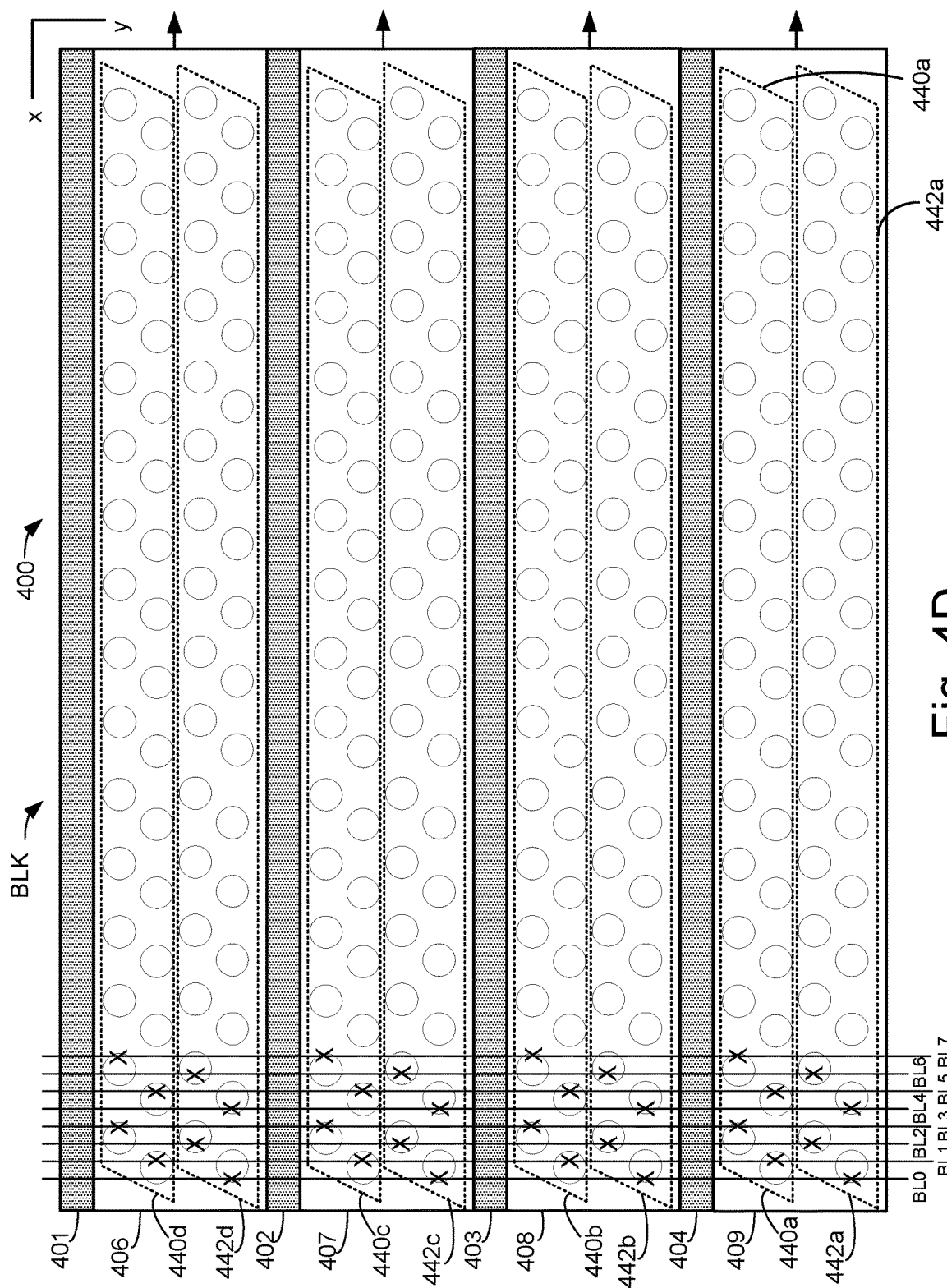
FIG. 4D depicts one embodiment of how memory cells can be grouped into partial pages.
Figure 4E:
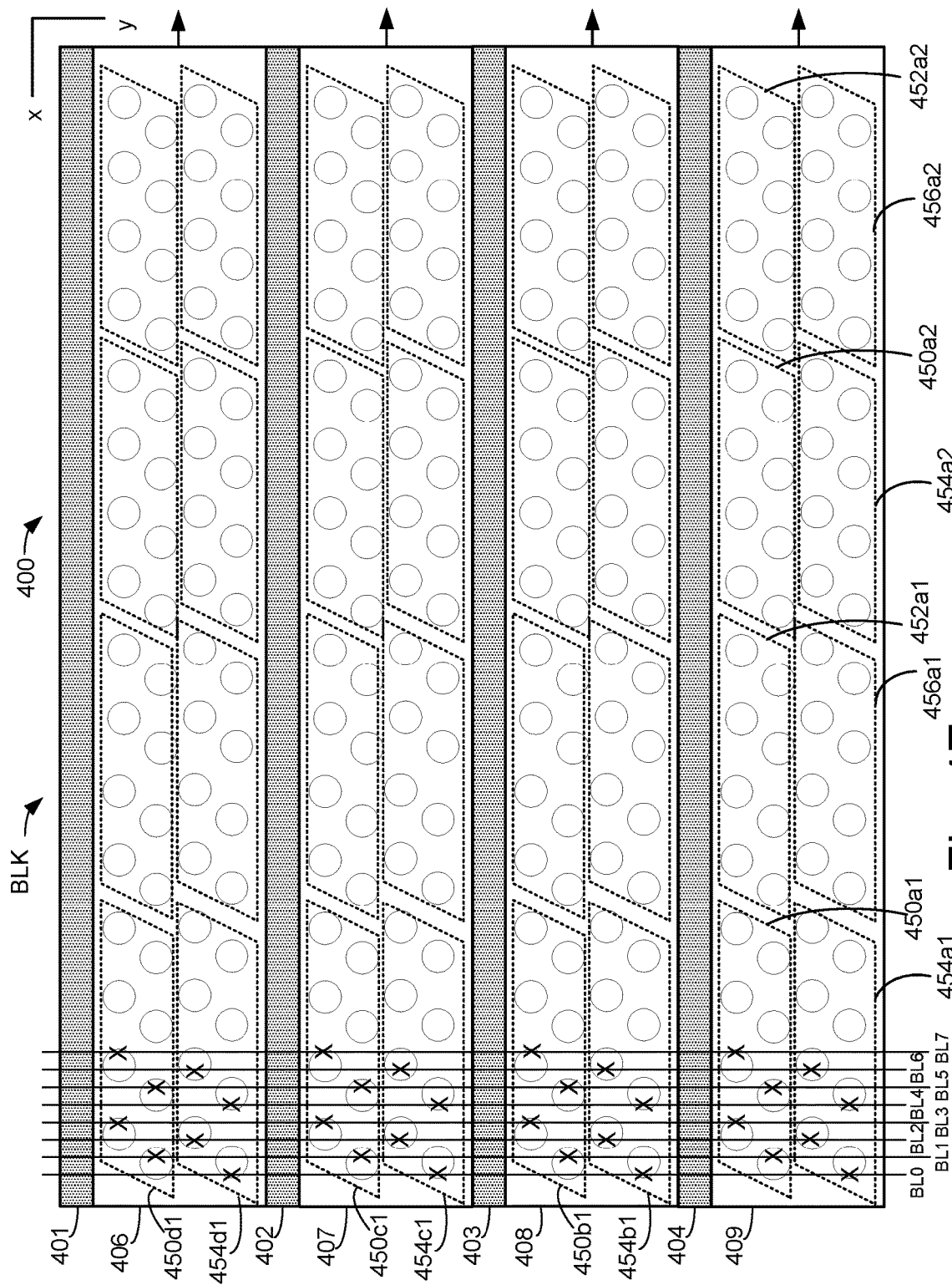
FIG. 4E depicts another embodiment of how memory cells can be grouped into partial pages.

FIGS. 4D and 4E depicts two embodiments of how memory cells can be grouped into partial pages. Therefore, a partial page can be programmed into or read from the group. FIG. 4D depicts a top view of the example word line layer 400, which is depicted in FIG. 4A. Some of the bit lines (BL0-BL8) that were depicted in connection with SGD layer 420 in FIG. 4B are also depicted to illustrate the relationship between the bit lines and the memory cells. Four sub-blocks 406, 407, 408, and 409 are depicted. Each sub-block extends in the x-direction as indicated by the arrows adjacent to each sub-block.

One embodiment of a partial page mode has two partial pages per sub-block at a word line layer. Note that in one embodiment of a full page mode there is one full page of memory cells in the sub-block. Herein, when there are two partial pages per page, this will be referred to as a two partial page mode. One embodiment includes a two partial page programming (or 2PPP) mode. One embodiment includes a two partial page reading mode. A first partial page 440a and a second partial page 442a are shown for sub-block 409 for word line layer 400. A first partial page 440b and a second partial page 442b are shown for sub-block 408 for word line layer 400. A first partial page 440c and a second partial page 442c are shown for sub-block 407 for word line layer 400. A first partial page 440d and a second partial page 442d are shown for sub-block 406 for word line layer 400. As one example, each partial page comprises 8,192 data memory cells. Hence, each partial page may store 8 kB of data in this example, if a single bit is stored per memory cell.

The reference numeral 440 will be used to refer to one or more of the first partial pages without reference to a specific first partial page. The reference numeral 442 will be used to refer to one or more of the second partial pages without reference to a specific second partial page. The memory cells of the first partial pages 440 are coupled to the odd bit lines. The memory cells of the second partial pages 442 are coupled to the even bit lines. Herein, even and odd bit lines refers to the numbers given to bit lines that are ordered sequentially in accordance with their physical position. Hence, even and odd bit lines alternate with each other. The set of odd bit lines is one example of a non-contiguous set of bit lines. Note that the odd set of bit lines extend parallel to each other and have at least one even bit line between and extending parallel to two members of the odd set of bit lines. In other words, none of the odd bit lines are adjacent to another odd bit line. The set of even bit lines is another example of a non-contiguous set of bit lines. Note that the even set of bit lines extend parallel to each other and have at least one odd bit line between and extending parallel to two members of the even set of bit lines. In other words, none of the even bit lines are adjacent to another even bit line.

In general, an odd bit line is neighbored by two even bit lines, and an even bit line is neighbored by two odd bit lines. However, there may be some exceptions to this rule. For example, BL0 only has one neighboring odd bit line in the block. The bit lines depicted in FIG. 4D may be referred to as data bit lines, as they are coupled to memory cells. With some architectures, there may be one or more dummy bit lines that are not coupled to memory cells. It is possible for dummy bit lines to separate groups of data bit lines in a block. However, the general pattern of alternating odd and even data bit lines will still exist in the block. Herein, when a bit line is not referred to specifically as a data bit line or a dummy bit line, it will be understood that a data bit line is being referred to.

Note that the alternating bit lines is in contrast to one embodiment of a full page mode. In one embodiment of a full page mode, the full page comprises both the first partial page 440 and the second partial page 442 in a sub-block. For example, a full page in sub-block 409 comprises first partial page 440a and second partial page 442a. Thus, the memory cells in the full page are coupled to all of the bit lines in a physical sequence of parallel bit lines, in this full page example. In this example, the memory cells in the full page are coupled to a contiguous set of bit lines. In one embodiment, a contiguous set of bit lines contains all of the bit lines coupled to memory cells in a sub-block. However, a contiguous set of bit lines is not required to include all of the bit lines that are coupled to memory cells in a sub-block. For example, a contiguous set of bit lines might include the first 4,096 bit lines in a sequence of 8,192 bit lines coupled to memory cells in a sub-block. It is possible for there to be more than one contiguous set of bit lines coupled to memory cells in a sub-block. For example, a first contiguous set of bit lines might include the first 2,048 bit lines and a second contiguous set of bit lines might include the third 2,048 bit lines in a sequence of 8,192 bit lines coupled to memory cells in a sub-block.

In some embodiments, the programming order for partial page programming in a block is: first partial page 440a, second partial page 442a, first partial page 440b, second partial page 442b, first partial page 440c, second partial page 442c, first partial page 440d, second partial page 442d. Thus, in this example, the first partial pages in a sub-block are programmed prior to the second partial pages in the sub-block. Stated another way, the partial page associated with odd bit lines in a sub-block are programmed prior to the partial page associated with the even bit lines. However, this order could be reversed. Note that in the foregoing programming order, both the partial pages are programmed in a sub-block prior to programming the partial pages in an adjacent sub-block. The sub-block order moves from one side of the block to the other in the y-direction. The order could go from sub-block 409 to 406 or from sub-block 406 to 409. In general, the sub-blocks may be programmed in any order.

FIG. 4E depicts a top view of the example word line layer 400 of FIG. 4D, but depicts a different configuration for the partial pages. One embodiment of a partial page mode has four partial pages per sub-block at a word line layer. One embodiment will be referred to as a four partial page programming (or 4PPP) mode. One embodiment includes a four partial page reading mode. Sub-block 409 shows memory cells grouped into a first partial page 450a, a second partial page 452a, a third partial page 454a, and a fourth partial page 456a. In this example, each partial page is divided into numerous partial page units. First partial page 450a is divided into partial page unit 450a1, 450a2, etc. Only two partial page units are depicted, but there may be many others as indicated by the arrow adjacent to sub-block 409. Similarly, second partial page 452a is divided into partial page units 452a1, 452a2, etc. Similarly, third partial page 454a is divided into partial page units 454a1, 454a2, etc. Similarly, fourth partial page 456a is divided into partial page units 456a1, 456a2, etc. In this example, each of the partial page unit has eight memory cells, but there could be more or fewer memory cells per partial page unit. As one example, there are a total of 4,096 data memory cells per partial page. Hence, each partial page may store 4 kB of data in this example, if a single bit is stored per memory cell. Some of the partial page unit (450b1, 454b1) in sub-block 408 are labeled. Some of the partial page unit (450c1, 454c1) in sub-block 407 are labeled. Some of the partial page unit (450d1, 454d1) in sub-block 406 are labeled.

The reference numeral 450 will be used to refer to one or more of the first partial pages without reference to a specific first partial page. The reference numeral 452 will be used to refer to one or more of the second partial pages without reference to a specific second partial page. The reference numeral 454 will be used to refer to one or more of the third partial pages without reference to a specific third partial page. The reference numeral 456 will be used to refer to one or more of the fourth partial pages without reference to a specific fourth partial page.

The memory cells of the first partial pages 450 in each sub-block are coupled to some of the odd bit lines. In this example, memory cells of the first partial pages 450 are coupled to half of the odd bit lines. The memory cells of the second partial pages 452 in each sub-block are coupled to some of the even bit lines. In this example, memory cells of the second partial pages 452 are coupled to half of the even bit lines. The memory cells of the third partial pages 454 in each sub-block are coupled to some of the odd bit lines. In this example, memory cells of the third partial pages 454 are coupled to half of the odd bit lines. In particular, the memory cells of the third partial pages 454 are coupled to the odd bit lines to which the memory cells of the first partial pages 450 are not coupled. In other words, the set of odd bit lines coupled to the first partial pages 450 and the set of odd bit lines coupled to the third partial pages 454 are mutually exclusive sets (e.g., the sets have no bit lines in common). The memory cells of the fourth partial pages 456 in each sub-block are coupled to some of the even bit lines. In this example, memory cells of the fourth partial pages 456 are coupled to half of the even bit lines. In particular, the memory cells of the fourth partial pages 456 are coupled to the even bit lines to which the memory cells of the second partial pages 452 are not coupled. In other words, the set of even bit lines coupled to the second partial pages 452 and the set of even bit lines coupled to the fourth partial pages 456 are mutually exclusive sets (e.g., the sets have no bit lines in common).

In some embodiments, the programming order for partial page programming in sub-block 409 is: first partial page 450*a*, second partial page 452*a*, third partial page 454*a*, fourth partial page 456*a*. This results in the two partial pages associated with odd bit lines being programmed prior to the two partial pages associated with the even bit lines. However, the two partial pages associated with even bit lines could be programmed prior to the two partial pages associated with the odd bit lines. Also, it is not required that the two partial pages associated with odd bit lines be programmed in sequence. For example, one of the partial pages associated with the even bit lines could be programmed between programming of the two partial pages associated with the odd bit lines. After the four partial pages in sub-block 409 are programmed, then the four partial pages in sub-block 408 are programmed in a similar sequence. Next, the four partial pages in sub-block 407 are programmed in a similar sequence. Then, the four partial pages in sub-block 406 are programmed in a similar sequence. However, the order in which the sub-blocks are programmed could be reversed. In general, the sub-blocks may be programmed in any order.

The memory systems discussed above can be erased, programmed/written and read. At the end of a successful programming process, the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 6 depicts example threshold voltage when the memory cells store one bit of data per memory cell in a binary or single-level cell (SLC) format. For example, FIG. 6 shows a graph depicting two threshold voltage distributions 2 and 4. The x axis plots threshold voltage and the y axis plots the number of memory cells. Threshold voltage distribution 2 is less than zero volts and threshold voltage distribution 4 is greater than zero volts. In one embodiment, threshold voltage distribution 2 corresponds to erased memory cells that store data "1." In one embodiment, threshold voltage distribution 4 corresponds to programmed memory cells that store data "0." In other embodiments, both threshold voltage distributions can be positive voltages, or both can be negative voltages. The voltage V verify is the verify reference voltage used to verify whether memory cells have been successfully programmed (see step 774 of FIG. 7B, discussed below). The voltage Vr is the read reference voltage used to sense whether the memory cells are erased or programmed (see step 804 of FIG. 8, discussed below).

The proposed technology described herein can be used for embodiments in which each memory cell stores one bit of data per memory cell (FIG. 6) and for embodiments in which each memory cell stores multiple bits of data per memory cell (FIG. 5).

Figure 7A:
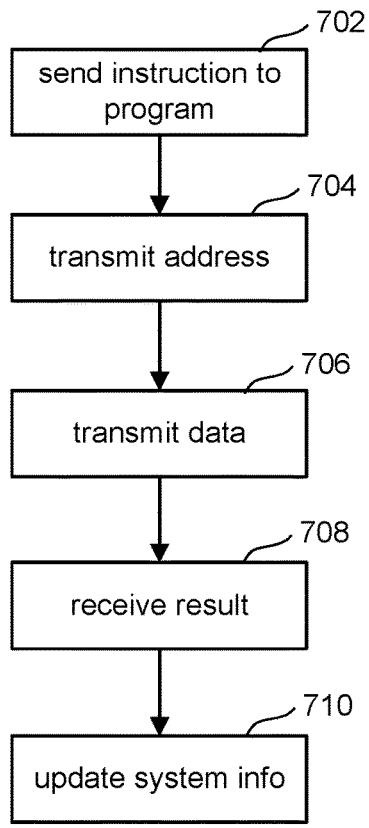
FIG. 7A is a flow chart describing one embodiment of a process for programming/writing.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. Controller 122 can also scramble the data prior to programming the data in the memory.

Figure 7B:
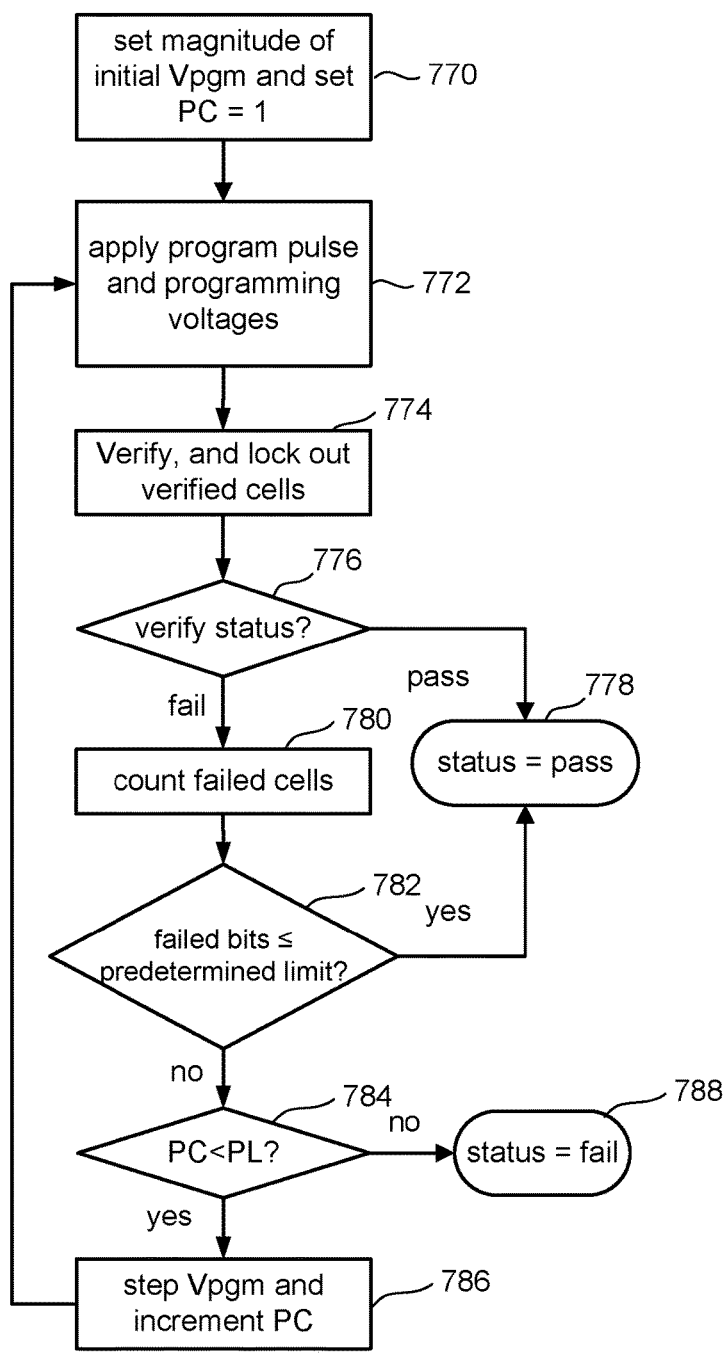
FIG. 7B is a flow chart describing one embodiment of a process for programming/writing data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above (see FIG. 1), at the direction of state machine 112. The process of FIG. 7B can also be used to implement the full sequence programming discussed above. The process of FIG. 7B can also be used to implement each phase of a multi-phase programming process. Additionally, the process of FIG. 7B can be used to program memory cells connected to the same word line with one bit of data per memory cell, as per FIG. 6.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5 or Vr of FIG. 6) or verify operation (e.g. see verify reference voltages Vv1, Vv2, Vv3, Vv4, Vv5, Vv6, and Vv7 of FIG. 5 or V verify of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Figure 7C:
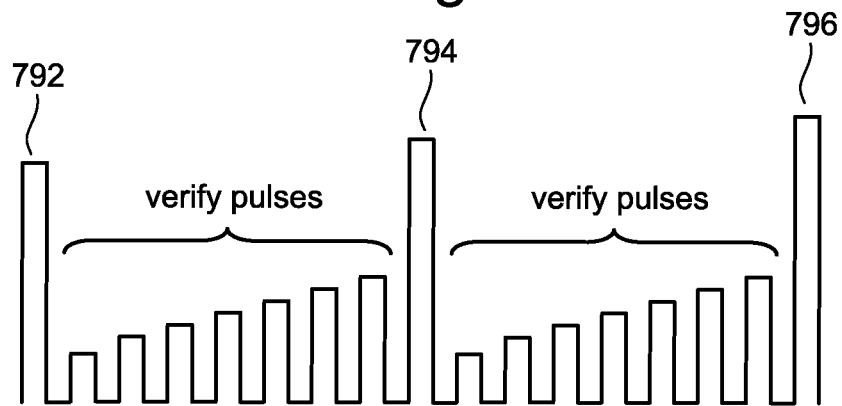
FIG. 7C depicts an example word line voltage level during programming/writing and verify operations.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

When sensing a memory cell, the bit line coupled to the memory cell is biased to a pre-determined bit line voltage, in one embodiment. Bit lines coupled to memory cells in a selected block that are not being sensed are grounded, in one embodiment. Therefore, when sensing memory cells coupled to alternate bit lines, each selected bit line is adjacent to a bit line that is grounded. Capacitive coupling between the bit lines can slow the rate at which the bit line voltage ramps up and/or settles down. If the bit line voltage is not given enough time to ramp up and/or settle down, then a sensing operation may fail to read the proper state of the memory cell. A cell that is misread may be referred to herein as a "fail bit." This problem is most severe when sensing memory cells grouped into partial pages as in the example in FIG. 4D. Embodiments disclosed herein reduce the fail bit count (or memory cell misreads) during a sensing operation. The sensing operation could be a read or verify operation.

It is also possible that the foregoing sensing issue can cause a program operation to take additional program loops to complete. In some embodiments, when data is first stored in the memory array 126 SLC programming is used to save programming time. This SLC programming might program partial pages. Later, the data is re-written using MLC programming, which typically takes much longer than SLC programming. Some designs have a target of a single program loop for a partial page SLC programming operation to complete. In some embodiments, a partial page programming operation is only given a very limited amount of program loops to complete. For example, an SLC partial page programming operation might be only given three program loops to complete. If the program operation is not complete in this limited number of program loops, the program process ends in failure. Embodiments disclosed herein prevent or at least reduce partial page programming operations ending in failure by managing a bit line settling time during program verify. Embodiments disclosed herein prevent or at least reduce partial page SLC programming operations ending in failure by managing a bit line settling time during program verify.

Figure 8:
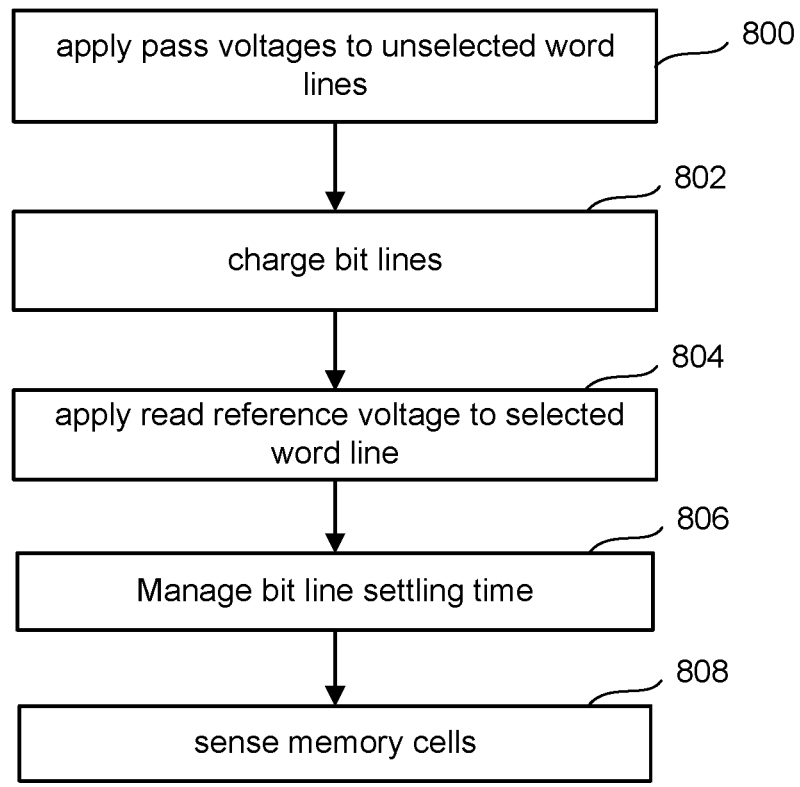
FIG. 8 is a flow chart describing one embodiment of a process for sensing data from non-volatile memory cells.

FIG. 8 is a flow chart describing a sensing operation of memory cells. The sensing operation may be used during a read operation or a program verify operation. In step 800, a pass voltage is applied to unselected word lines so that unselected memory cells on a NAND string are conducting, which enables the system to test whether the selected memory cell conducts in response to the read reference voltage. This pass voltage may be referred to herein as Vread.

In step 802, bit lines coupled to memory cells to be sensed are charged. In one embodiment, all of the bit lines in a selected block are charged. In one embodiment, alternating bit lines in a selected block are charged. For example, all of the even bit lines may be charged, or all of the odd bit lines may be charged. In one embodiment, bit lines coupled to memory cells in the selected block that are not to be sensed are grounded.

In step 804, the appropriate read reference voltage, also referred to as Vcgr, is applied to the selected word line. In one example of a system that stores one bit per memory cell, Vcgr=0V, or a small voltage near 0V.

Step 806 includes managing a bit line settling time. Managing the bit line settling time improves sensing accuracy. When performed during a program verify this can reduce the number of program loops it takes to complete programming. In one embodiment, when sensing a first set of memory cells coupled to a contiguous set of bit lines a first bit line settling time is used. However, when sensing a second set of memory cells coupled to a non-contiguous set of bit lines a second bit line settling time is used. The second bit line settling time is longer than the first bit line settling time, in one embodiment. The second set of the memory cells are coupled to alternating bit lines, in one embodiment. For example, the second set of the memory cells may be first partial page 440a (see FIG. 4D), or first partial page 450a (see FIG. 4E). When sensing the second set of memory cells, there are no memory cells being sensed that are coupled to a contiguous set of bit lines, in one embodiment. For example, when sensing first partial page 440a, none of the memory cells are coupled to a contiguous set of bit lines, in one embodiment. In one embodiment, a longer second bit line settling time is used when the non-contiguous set comprises alternating bit lines for at least half of the bit lines associated with the selected word line. For example, a longer second bit line settling time is used for a sensing the partial pages in FIG. 4D then for the partial pages in FIG. 4E. Further details of managing bit line settling times are discussed with respect to FIGS. 10-15.

Step 808 including sensing memory cells. In one embodiment, a sensing capacitor in the sense amplifier is charged to sensing voltage. Then, the bit line is connected to the charged capacitor for a predetermined time period, referred to as the "integration time" or "strobe time". Depending on the state of the memory cell, a current from the memory cell may flow through the bit line and discharge the sensing capacitor. After the predetermined time period, the voltage of the sensing capacitor is sampled to see whether the respective memory cell(s) conducted in step 808. If the memory cell conducts in response to Vcgr, then the threshold voltage of the memory cell is less than Vcgr. If Vcgr=0V and the memory cell turns on, then the memory cell is in the erased state and the data stored is 1. If Vcgr=0V and the memory cell does not turn on, then the memory cell is in the programmed state and the data stored is 0.

Figure 9:
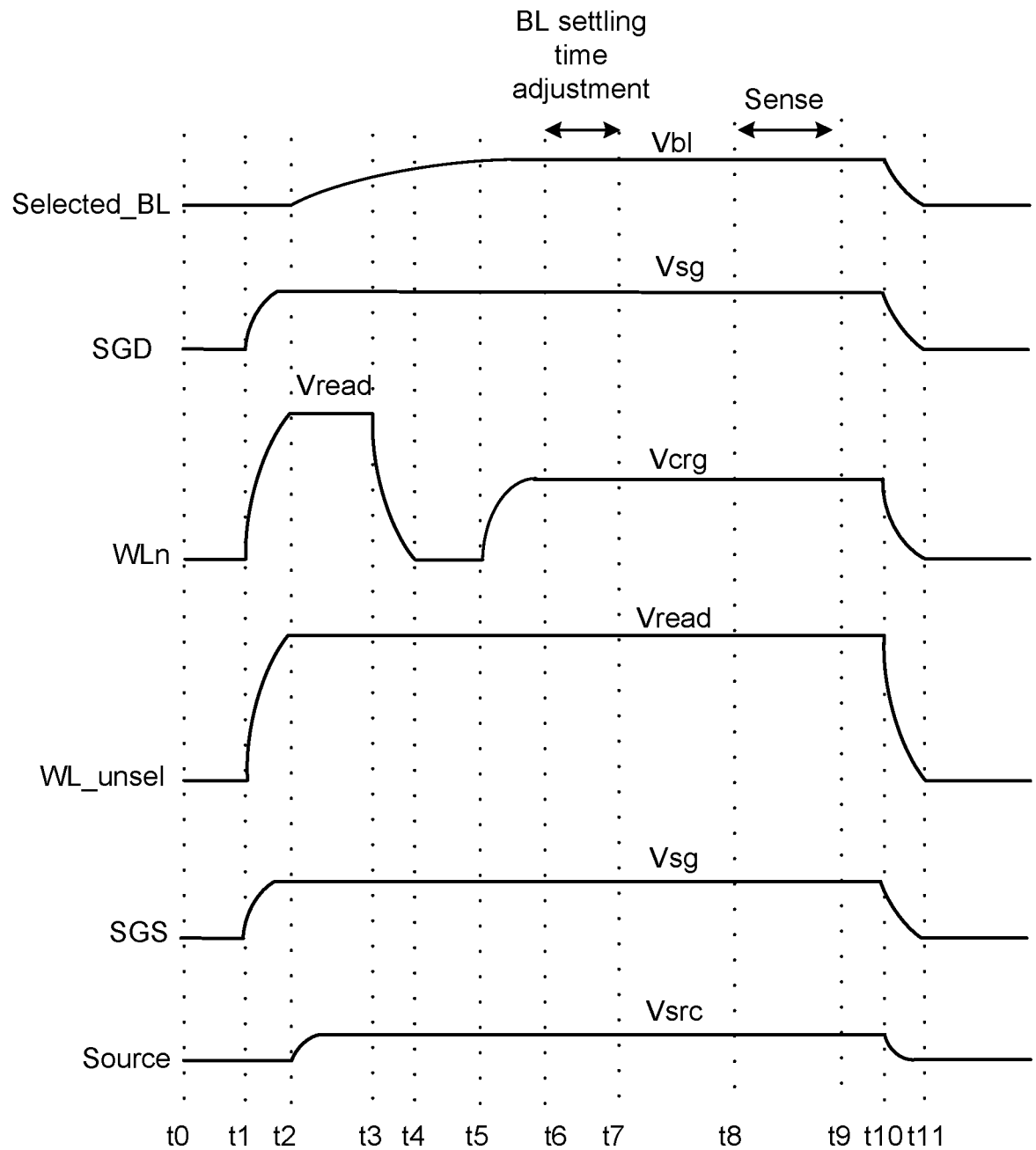
FIG. 9 depicts voltage waveforms during one embodiment of sensing memory cells.

FIG. 9 depicts voltage waveforms during one embodiment of sensing memory cells. These waveforms are used during one embodiment of the process of FIG. 8. FIG. 9 depicts six signals: WLn (the selected word line), Source (the Source line), WL unsel (the unselected word lines), SGD, SGS, and Selected BL (one or more selected bit lines). FIG. 9 shows the signals from time t0 through time t11.

At time t1, a Vread pulse is applied to the selected word line WLn. In one embodiment, Vread is between six and nine volts (e.g., 7.4 volts); however, other values for Vread can also be used. The selected word line WLn is discharged at t3. The Vread pulse applied to the selected word line WLn from t1 to t3 is a Vread stress voltage. The Vread pulse can be applied as part of a Vread spike, as part of a sequential read process, as part of reading WLn+1 in order to account for capacitive coupling, or other reason. The Vread pulse applied to the selected word line WLn between time t1 to t4 is optional.

The unselected word lines, WL unsel (all or a subset) receive a Vread pulse at time t1. The unselected word lines are held at Vread until time t10. This is one embodiment of step 800. SGD and SGS will rise to a high voltage, Vsg (e.g. 3.5 volts), at t1 to turn on the select gates. At time t2, the Source line is Vsrc (e.g., 1.2 volts).

At time t2, the bit line is raised towards Vbl (e.g., 1.5 volts). Depending on the voltages applied to other bit lines (e.g. neighboring contiguous and/or non-contiguous bit lines), it may take considerable time for the bit line voltage to stabilize at Vbl. The impact of capacitive coupling with other bit lines may slow the ramp rate of the voltage on the selected bit line. In the waveform in FIG. 9, the bit line voltage stabilizes between time t5 and t6. However, it could take a longer or a shorter time to stabilize. It is possible that the bit line voltage could overshoot the target voltage of Vbl; however, the bit line voltage will not necessarily overshoot the target voltage of Vbl. Ramping up the bit line voltage starting at time t2 is one embodiment of step 802. Note that starting to ramp the bit line voltage at time t2 is one example. In some embodiments, the bit line voltage could start to ramp up earlier or later. The bit line voltage is maintained at Vbl until time t10.

The selected word line WLn is raised to the read reference voltage (Vcrg) a time t5. The selected word line is held at Vcrg until time t10. Applying the read compare voltage (Vcrg) between time t5 and t10 is one embodiment of step 804.

A bit line settling time adjustment is depicted between time t6 and t7. A bit line settling time parameter is used to control the length of time between time t6 and t7, in one embodiment. The memory cell is sensed between time t8 and t9. The bit line settling time is the time between applying the voltage to the bit line (e.g., time t2) to the time when sensing of the memory cell begins (e.g., time t8). The bit line settling time parameter is an adjustable parameter that allows the system to manage how much time the bit line voltage is allowed to settle prior to sensing of the memory cell at time t8. If the bit line is not given adequate time to settle, sensing of the memory cell may be inaccurate. Managing the length of time between t6 and t7 is one embodiment of step 806. The bit line settling time adjustment could be in another location. For example, the bit line settling time adjustment could be anywhere between time t5 and t8, in one embodiment. In other words, time period t6 to t7 could be moved earlier (such that time t6 is closer to t5) or later (such that time t7 is closer to t8). The bit line settling time parameter may be used to adjust a period of time other after time t5, in one embodiment. For example, the bit line settling time parameter may be used to adjust the period of time between time t4 and t5, in one embodiment.

If the targeted memory cell has Vt greater than Vcrg, then applying Vcrg will turn on the memory cell and allow the NAND string to conduct sufficient current, which is sensed by the sense amplifier to be higher than its trip point, and thus the memory cell is judged to be ON. If the targeted memory cell has Vt less than Vcrg, then the memory cell will not will not conduct in response to Vcrg at its control gate, and thus the memory cell will be judged as OFF. The sensing at time t8 is one embodiment of step 808.

Figure 10:
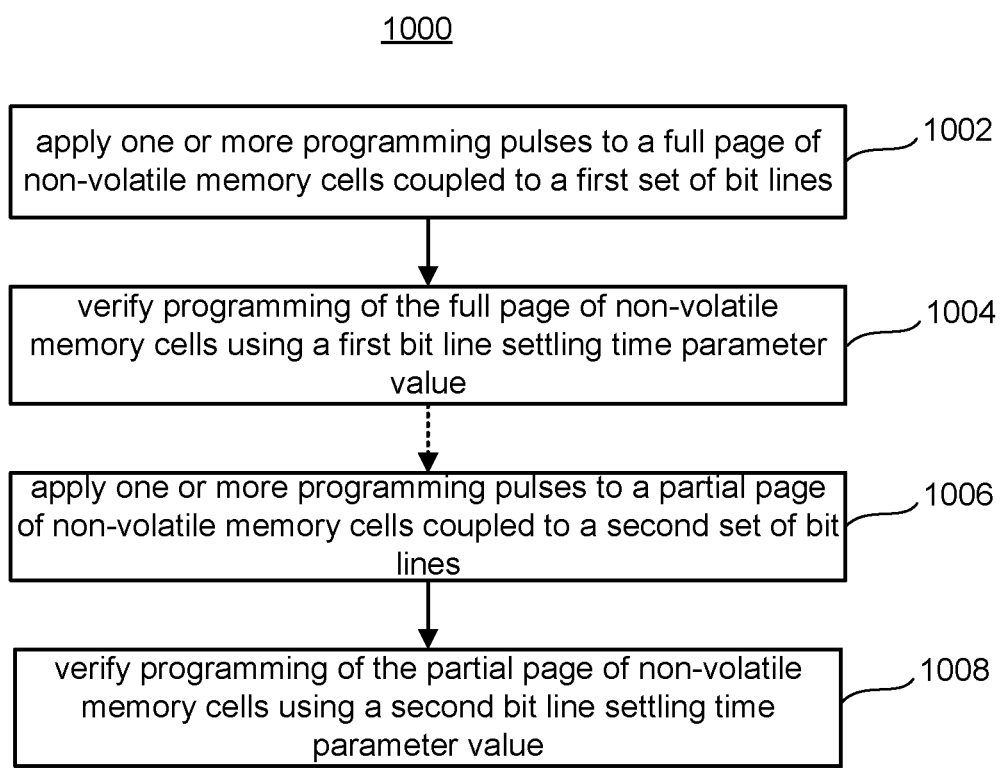
FIG. 10 is a flowchart of one embodiment of a process of managing bit line settling times during program operations.

FIG. 10 is a flowchart of one embodiment of a process 1000 of managing bit line settling times during program operations. Step 1002 includes applying one or more programming pulses to a full page of non-volatile memory cells coupled to a first set of bit lines. In one embodiment, the full page of non-volatile memory cells comprises all of the memory cells in a sub-block at one word line layer in a 3D memory device. For example, the memory cells could be all of the memory cells in sub-block 409 of word layer 400. The first set of bit lines comprises a contiguous set of bit lines, in one embodiment. The first set of bit lines could include all of the even and odd bit lines that are coupled to memory cells in the sub-block 409. The one or more programming pulses are applied during step 772 of the programming process of FIG. 7B, in one embodiment.

Step 1004 includes verifying programming of the full page of non-volatile memory cells using a first bit line settling time parameter value. The first bit line settling time parameter value results in a first bit line settling time. The verifying is performed step 774 of the programming process of FIG. 7B, in one embodiment. A dashed line is depicted between steps 1004 and 1006 to indicate that steps 1002 and 1004 may be performed as a part of the same programming process, and that steps 1006 and 1008 may be performed as a part of the same programming process.

Step 1006 includes applying one or more programming pulses to a partial page of non-volatile memory cells coupled to a second set of bit lines. In one embodiment, the partial page of non-volatile memory cells comprises less than all of the memory cells in a sub-block at one word line layer in a 3D memory device. For example, the partial page could be the first partial page 440a in sub-block 409 in FIG. 4D. As another example, the partial page could be the first partial page 450a in sub-block 409 in FIG. 4E (recall that this includes partial page units 450a1, 450a2, etc.). The second set of bit lines comprises a non-contiguous set of bit lines, in one embodiment. The second set of bit lines could include all of the odd (but none of the even bit lines) that are coupled to memory cells in the sub-block 409. For this case, the partial pages could be the first partial page 440a in sub-block 409 in FIG. 4D, the first partial page 450a in sub-block 409, or the second partial page 452a in sub-block 409. The second set of bit lines could include all of the even (but none of the odd bit lines) that are coupled to memory cells in the sub-block 409. For this latter case, the partial pages could be the second partial page 442a in sub-block 409 in FIG. 4D, the third partial page 454a in sub-block 409, or the fourth partial page 456a in sub-block 409. The one or more programming pulses are applied during step 772 of the programming process of FIG. 7B, in one embodiment.

Step 1008 includes verifying programming of the partial page of non-volatile memory cells using a second bit line settling time parameter value. The second bit line settling time parameter value results in a second bit line settling time. The verifying is performed step 774 of the programming process of FIG. 7B, in one embodiment. The second bit line settling time is longer than the first bit line settling time, in one embodiment. The longer bit line settling time helps the program verify operation of step 1008 to be more accurate. The shorter bit line settling time in step 1004 helps the verify operation in step 1004 to complete faster. The longer bit line settling time in step 1008 helps the partial page program operation (in step 1006-1008) complete in fewer program loops. The longer bit line settling time in step 1008 helps the partial page program operation (in step 1006-1008) to complete without returning a program fail due to, for example, taking too many program loops.

Figure 11:
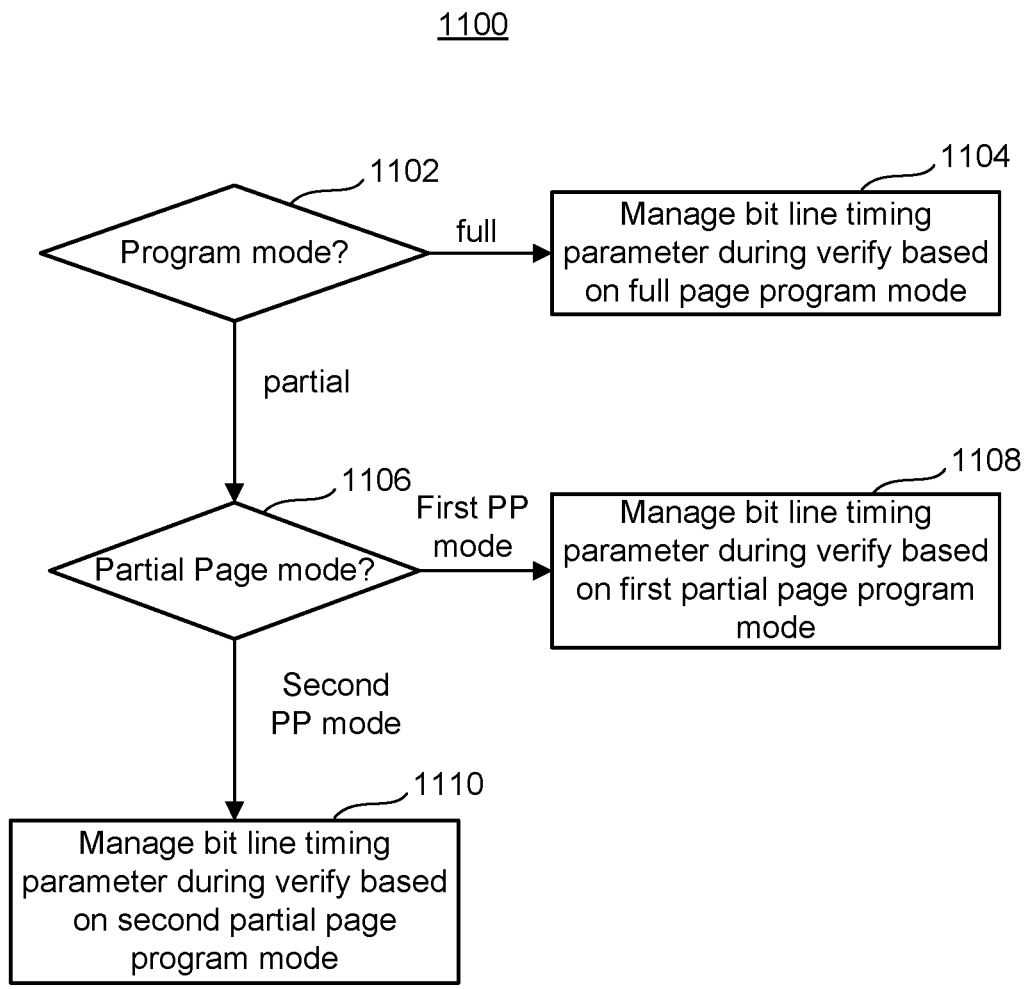
FIG. 11 is a flowchart of one embodiment of a process of managing bit line settling time based on a program mode.

FIG. 11 is a flowchart of one embodiment of a process 1100 of managing bit line settling time based on a program mode. The program modes include at least one full page program mode and two or more partial page program modes, in one embodiment. An example of the full page program mode is programming a page of memory cells in a sub-block, as has been previously discussed. An example of one partial page program mode is programming two partial pages of memory cells in a sub-block (e.g., 2PPP mode), as has been previously discussed with respect to FIG. 4D. Another example of a partial page program mode is programming four partial pages of memory cells in a sub-block (e.g., 4PPP), as has been previously discussed with respect to FIG. 4E.

Step 1102 includes a determination of the programming mode. If the programming mode is a full page programming mode, then step 1104 is performed. Step 1104 includes managing bit line timing during verify based on the full program mode. Step 1104 includes managing a length of time between applying a bit line voltage and sensing memory cells based on the full page programming mode. In some embodiments, memory cells being programming in the full page programming mode are coupled to a contiguous set of bit lines.

The full page programming mode programs two or more pages into the memory cells, in one embodiment. In other words, the full page programming mode programs two or more bits into each of the memory cells, in one embodiment. The full page programming mode programs one page into the memory cells, in one embodiment. In other words, the full page programming mode programs one bit into each of the memory cells, in one embodiment.

If the programming mode is a partial page programming mode, then step 1106 is performed. Step 1106 is a determination of whether this is a first partial page programming mode or a second partial page programming mode. If this is the first partial page programming mode, step 1108 is performed. In one embodiment, the first partial page programming mode programs four partial pages per page of memory cells. In one embodiment, the first partial page programming mode is the 4PPP mode. Step 1108 includes managing bit line timing during verify based on the first partial page program mode. Step 1108 includes managing a length of time between applying a bit line voltage and sensing memory cells based on the first partial page programming mode. The first partial page programming mode programs one bit into each of the memory cells, in one embodiment. However, the first partial page programming mode could also be used to program two or more bits per memory cell.

If this is the second partial page programming mode, step 1110 is performed. Step 1110 includes managing bit line timing during verify based on the second partial page program mode. In one embodiment, the second partial page programming mode programs two partial pages per page of memory cells. In one embodiment, the second partial page programming mode is the 2PPP mode. Step 1110 includes managing a length of time between applying a bit line voltage and sensing memory cells based on the second partial page programming mode. The second partial page programming mode programs one bit into each of the memory cells, in one embodiment. However, the second partial page programming mode could also be used to program two or more bits per memory cell.

The following discussion will illustrate some of the ways in which the bit line timing can be managed based on the program mode. In one embodiment, the bit line settling time is longer for the 2PPP mode than for the 4PPP mode. A reason for this can be understood by referring to the examples in FIGS. 4D and 4E. In the 2PPP mode of FIG. 4D, the memory cells in the first partial page 440a are coupled to all of the odd bit lines. The memory cells in the second partial page 442a are coupled to all of the even bit lines. Thus, half of the bit lines are selected and half are unselected in the 2PPP mode. Moreover, this is an alternating pattern of selected and unselected bit lines. The unselected bit lines may be grounded during program verify.

In the 4PPP mode of FIG. 4E, only half the odd bit lines or half of the even bit lines are selected. For example, for the first partial page 450a half of the odd bit lines are selected, and for the third partial page 454a half of the even bit lines are selected. Moreover, alternating "chunks" of bit lines are selected. For example, BL1, BL3, BL5, BL7, BL9, BL11, BL13, and BL15 are selected for partial page unit 450a1 and BL33, BL35, BL37, BL39, BL41, BL43, BL45, and BL47 are selected for partial page unit 450a2. Hence, in additional to none of even bit lines being selected none of the odd bit lines associated with the second partial page 452a are selected. This pattern means that the bit line capacitive coupling issue is less severe in one embodiment of 4PPP mode than in one embodiment of a 2PPP mode. Hence, a longer bit line settling time is used for one embodiment of a 2PPP mode than for one embodiment of a 4PPP mode.

In one embodiment, the bit line settling time is shorter for the full page programming mode than for either the first or second partial page programming modes. For the full programming mode, all of the bit lines in the block may be selected during program verify. This is in contrast with partial page programming modes in which less than all of the bit lines are selected during program verify. As noted above, unselected bit lines may be grounded during program verify. Hence, the bit line capacitive coupling issue may be less severe for the full page programming mode. Therefore, the bit line settling time is shorter for the full page programming mode than for either the first or second partial page programming modes, in one embodiment.

Process 1100 can be modified to manage bit line settling time based on a reading mode. For example, different bit line settling times can be used for full page reading mode, a two partial page reading mode, and a four partial page reading mode. In one embodiment, the bit line settling time is shorter for the full page reading mode than for a partial page reading mode. In one embodiment, the bit line settling time is longer for the two partial page reading mode than for the four partial page reading mode.

As discussed, the bit line settling time may be longer for program verify of a partial page than a full page. In some embodiments, the bit line settling parameter is not extended in a partial page mode unless the partial page mode reaches a certain number of program loops. For example, on the first program loop of partial page programming, the bit line settling parameter can be the same as for full page programming. If the partial page programming reaches, for example, a second program loop then the bit line settling time may be extended, in one embodiment.

In some embodiments, the bit line settling parameter is not extended in a partial page mode unless block being programmed has failed partial page programming at least once. For example, if the block being programmed has not failed partial page programming, the bit line settling parameter can be the same as for full page programming.

Figure 12:
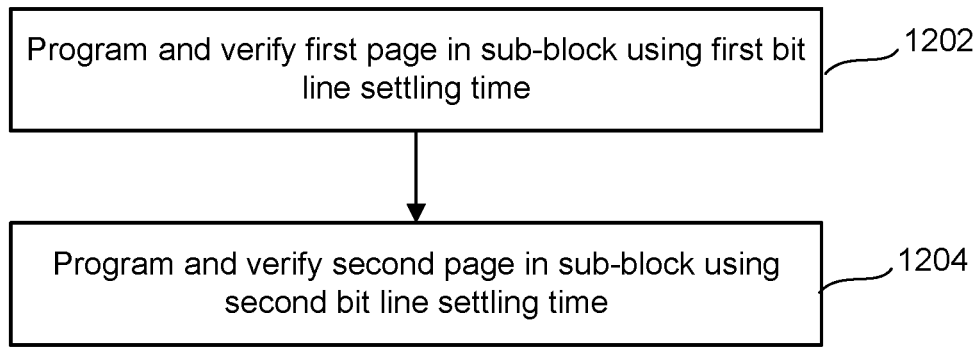
FIG. 12 is a flowchart of one embodiment of managing a bit line settling time when programming and verifying in a 2PPP mode.
Figure 13:
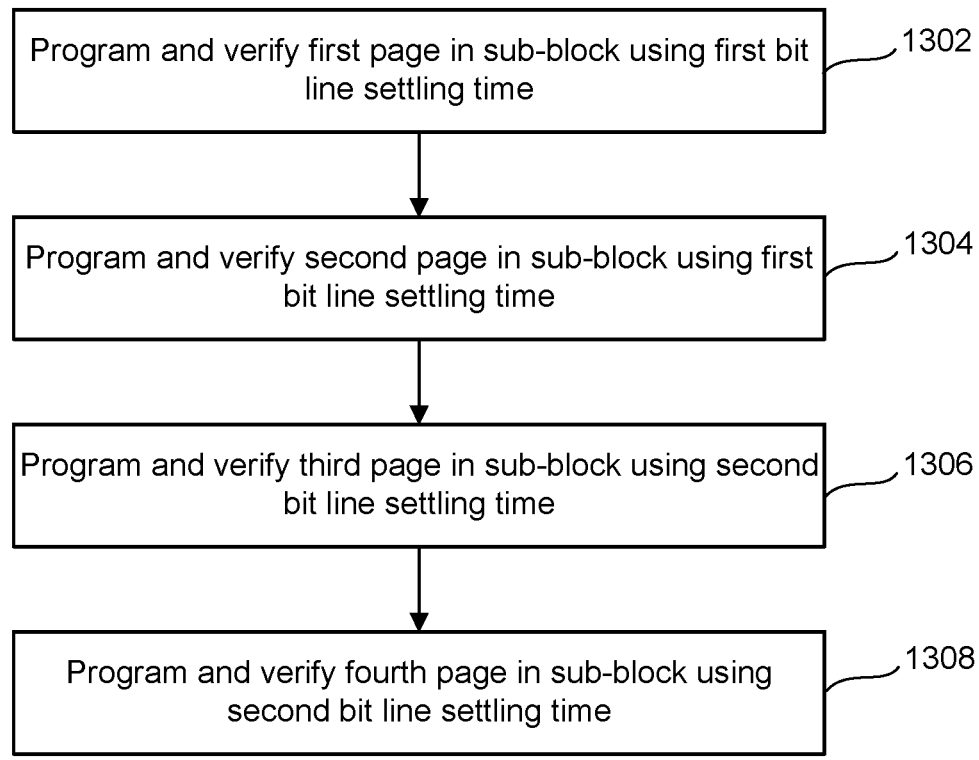
FIG. 13 is a flowchart of one embodiment of managing a bit line settling time when programming and verifying in a 4PPP mode.

In some embodiments, the bit line settling time during program verify depends on the order in which partial pages are programmed in a sub-block. In some embodiment, a longer bit line settling time is used for a partial page that is programmed after another partial page in the same sub-block. FIGS. 12 and 13 are flowcharts of embodiments in which the bit line settling time during program verify depends on the order in which partial pages are programmed in a sub-block. FIG. 12 is one embodiment of managing a bit line timing parameter based on a second partial programming mode. FIG. 13 is one embodiment of managing a bit line timing parameter based on a first partial programming mode.

FIG. 12 is a flowchart of one embodiment of managing a bit line settling time when programming and verifying in a 2PPP mode. In one embodiment, the process 1200 stores a single bit per memory cell (e.g., SLC). In one embodiment, the process 1200 stores multiple bits per memory cell (e.g., MLC). Reference will be made to programming sub-block 409 in FIG. 4D. Step 1202 includes programming and verifying a first partial page 440a in sub-block 409 using a first bit line settling time during program verify. Step 1204 includes programming and verifying a second partial page 442a in sub-block 409 using a second bit line settling time during program verify. The second bit line settling time is different from the first bit line settling time. The second bit line settling time is longer than the first bit line settling time, in one embodiment. The second bit line settling time is shorter than the first bit line settling time, in one embodiment. Using the different (e.g., longer) settling time for the second partial page can help the second partial page to program in fewer program loops (relative to using the first bit line settling time).

FIG. 13 is a flowchart of one embodiment of managing a bit line settling time when programming and verifying in a 4PPP mode. In one embodiment, the process 1300 stores a single bit per memory cell (e.g., SLC). In one embodiment, the process 1300 stores multiple bits per memory cell (e.g., MLC). Reference will be made to programming sub-block 409 in FIG. 4E. Step 1302 includes programming and verifying a first partial page 450a in sub-block 409 using a first bit line settling time during program verify. Step 1304 includes programming and verifying a second partial page 452a in sub-block 409 using the first bit line settling time during program verify. Step 1306 includes programming and verifying a third partial page 454a in sub-block 409 using a second bit line settling time during program verify. Step 1308 includes programming and verifying a fourth partial page 456a in sub-block 409 using the second bit line settling time during program verify. The second bit line settling time is different from the first bit line settling time. The second bit line settling time is longer than the first bit line settling time, in one embodiment. The second bit line settling time is shorter than the first bit line settling time, in one embodiment. Using the different (e.g., longer) settling time for the third and fourth partial pages can help the third and fourth partial pages to program in fewer program loops (relative to using the first bit line settling time).

Process 1300 could be modified to use a third bit line settling time for the second partial page 452*a* and a fourth bit line settling time for the fourth partial page 456*a*. As one example, the bit line settling time may increase in each step in process 1300.

Figure 14:
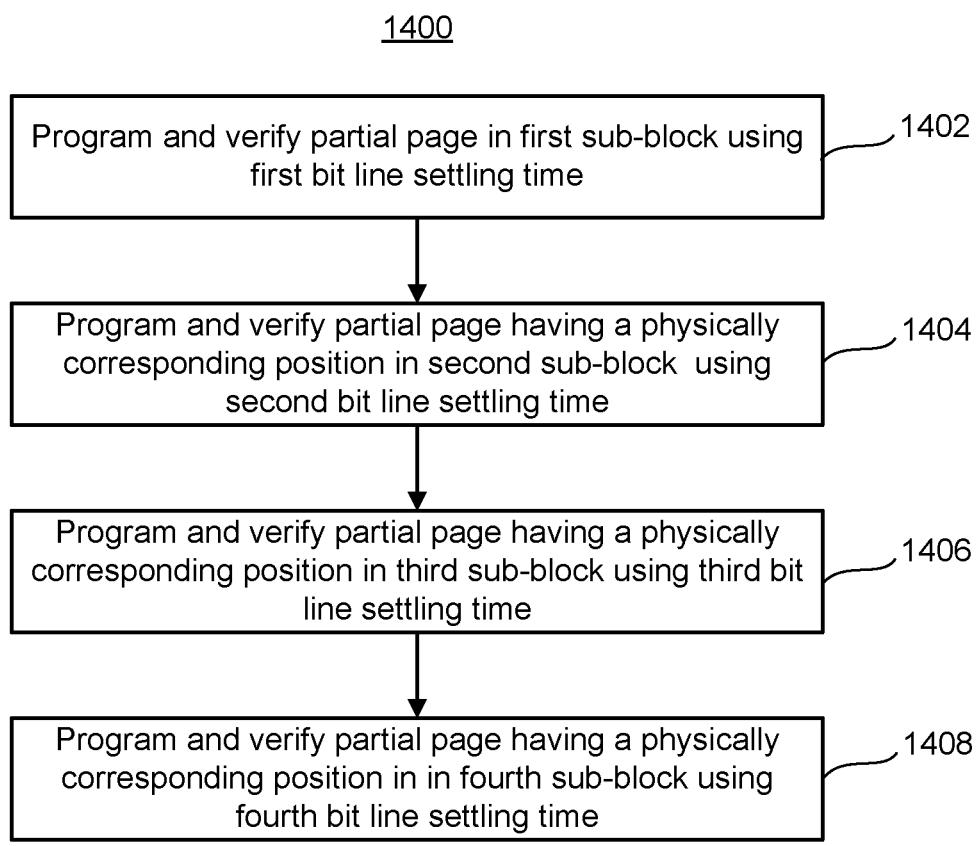
FIG. 14 is a flowchart of one embodiment in which the bit line settling time during program verify depends on the sub-block programmed in a block.

In some embodiments, the bit line settling time during program verify depends on when a partial page in a sub-block is programmed relative to partial pages in other sub-blocks in a block. FIG. 14 is a flowchart of one embodiment in which the bit line settling time during program verify depends on the order in which sub-blocks are programmed in a block. Process 1400 is used for the 2PPP mode, in one embodiment. Process 1400 is used for the 4PPP mode, in one embodiment. The bit line settling parameter may be different for the 2PPP mode than the 4PPP mode. In one embodiment, the process 1400 stores a single bit per memory cell (e.g., SLC). In one embodiment, the process 1400 stores multiple bits per memory cell (e.g., MLC). Reference will be made to FIG. 4D to illustrate an embodiment of process 1400.

Step 1402 includes programming and verifying a partial page (e.g., first partial page 440*a*) in a first sub-block (e.g., sub-block 409) using a first bit line settling time during program verify. Step 1404 includes programming and verifying a partial page (e.g., first partial page 440*b*) having a physically corresponding position in a second sub-block (e.g., sub-block 408) using a second bit line settling time during program verify. A "physically corresponding position" refers to a partial page in another sub-block of the block that has memory cells in the same relative physical position. For example, one set of "partial pages having physically corresponding positions" in FIG. 4D includes first partial pages 440*a*, 440*b*, 440*c*, and 440*d*. Another set of "partial pages having physically corresponding positions" in FIG. 4D includes second partial pages 442*a*, 442*b*, 442*c*, and 442*d*.

Step 1406 includes programming and verifying a partial page (e.g., first partial page 440*c*) having a physically corresponding position in a third sub-block (e.g., sub-block 407) using a third bit line settling time during program verify. Step 1408 includes programming and verifying a partial page (e.g., first partial page 440*d*) having a physically corresponding position in a fourth sub-block (e.g., sub-block 406) using a fourth bit line settling time during program verify. At least one of the bit line settling times is different from all of the others. In one embodiment, each of the four bit line settling times are different from each other. In one embodiment, two of the bit line settling times are the same. In one embodiment, the first bit line settling time is the shortest, the second and third are the same, and the fourth is the longest. In one embodiment, the bit line settling time gets longer with each step of process 1400. Using different (e.g., longer) bit line settling times for the later programmed sub-blocks can help the later programmed sub-blocks complete in fewer program loops (relative to using a shorter bit line settling time). Process 1400 may also be applied to the 4PPP mode of FIG. 4E.

Figure 15:
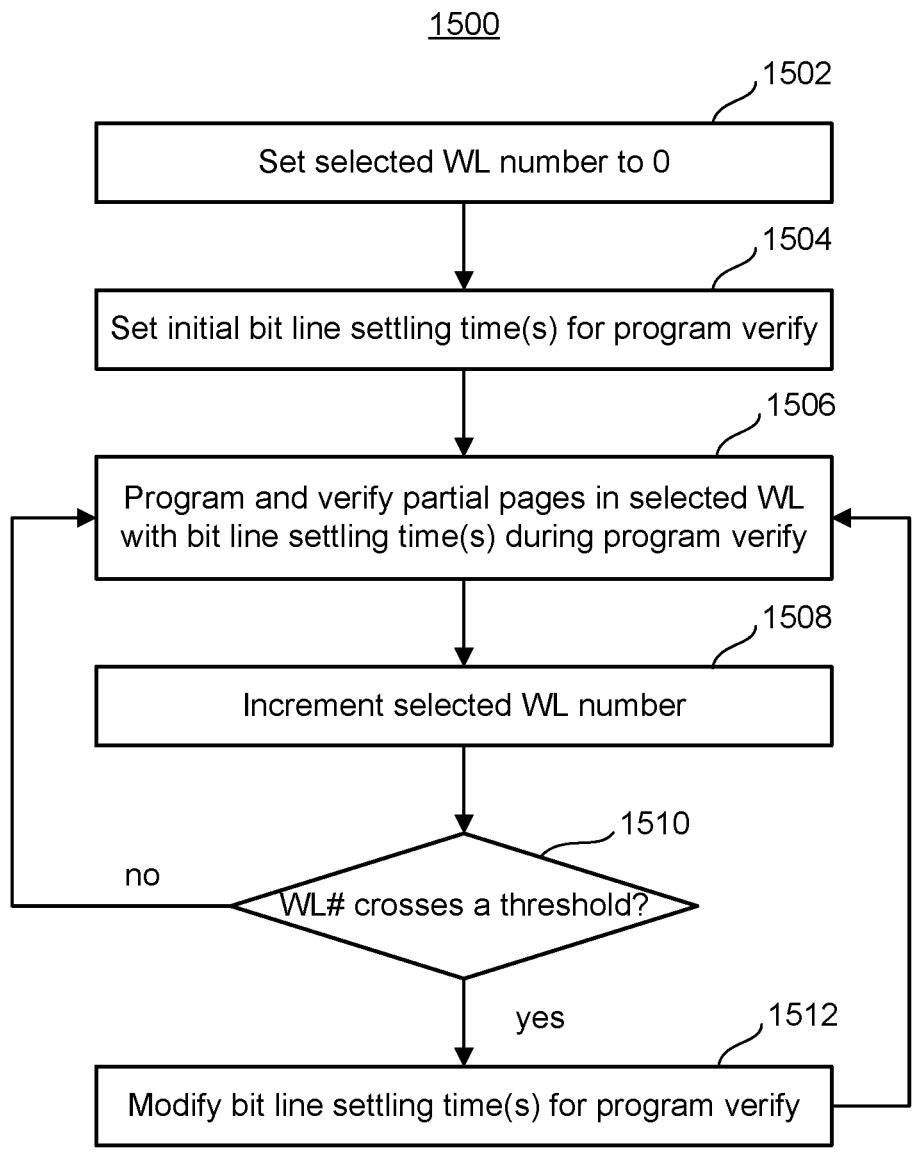
FIG. 15 depicts a flowchart of one embodiment of a process of managing bit line settling time during program verify based on a selected word line.

In some embodiments, the bit line settling time during program verify depends on when a partial page in a word line is programmed relative to partial pages in other word lines in a block. FIG. 15 depicts a flowchart of one embodiment of a process 1500 of managing bit line settling time during program verify based on a selected word line. Process 1500 is used for the 2PPP mode, in one embodiment. Process 1500 is used for the 4PPP mode, in one embodiment. The bit line settling parameter may be different for the 2PPP mode than the 4PPP mode. In one embodiment, the process 1500 stores a single bit per memory cell (e.g., SLC). In one embodiment, the process 1500 stores multiple bits per memory cell (e.g., MLC). Reference will be made to FIG. 4C to illustrate an embodiment of process 1400.

Step 1502 includes setting the selected word line number to WL0. The word line number refers to the physical location of the word line. For example, in FIG. 4C, the word lines are numbered sequentially from WL0 (which is closest to the source line) to WL 14 (which is closest to the bit line). In process 1500 the order of programming the word lines is from the word line closest to the source line to the word line closest to the bit line. With reference to FIG. 4C, the word lines are programmed from WL0 to WL14, in one embodiment. Process 1500 may be modified to change the order in which the word lines are programmed. In one embodiment, the word lines are programmed in order from the word line closest to the bit line to the word line closest to the source line. With reference to FIG. 4C, the word lines are programmed from WL14 to WL0, in one embodiment.

Step 1504 includes setting initial bit line settling time(s) for program verify. These times will be used for the selected word line. Process 1500 may be combined with other embodiments in which case there may be more than one bit line settling time for a selected word line. For example, process 1500 may be combined with process 1400 such that there may be different bit line settling times for different sub-blocks. Process 1500 may be combined with process 1200 or 1300 such that there may be different bit line settling times for different partial pages in the same sub-block. In one embodiment, process 1500 is combined with both process 1200 and process 1400. In one embodiment, process 1500 is combined with both process 1300 and process 1400.

Step 1506 includes programming and verifying partial pages in the selected word line using the present bit line settling time. Step 1508 includes incrementing the selected word line. Step 1510 is a determination of whether the selected word line has crossed a threshold. If so, then the bit line settling time(s) is/are modified in step 1512. In one embodiment, the bit line settling time(s) is/are increased in step 1512. In one embodiment, the bit line settling time(s) is/are decreased in step 1512. After modifying the bit line settling time(s), the process 1500 returns to step 1506 to program and verify the next selected word line. In the event that the bit line settling time is not modified (step 1510=no), the process 1500 also returns to step 1506 to program and verify the next selected word line.

There are one or more thresholds in step 1510, which allows the use of two or more different bit line settling times. In one embodiment, there is a single threshold in step 1510 to allow the use of two different bit line settling times. In one embodiment, there are two or more thresholds in step 1510 to allow three or more different bit line settling times. Whether to use more than one threshold, as at what word line(s) to set the threshold, is based on empirical data, in one embodiment.

FIG. 16A is a table 1600 that illustrates how bit line settling times can be managed based on several factors during one embodiment of 4PPP mode. One factor is whether the word line being programmed is less than or equal to "n" or greater than "n." The value of "n" could any number other than the highest numbered word line. Another factor is the sub-block being programmed. Still another factor is whether this is either the first or second partial page being programmed in the sub-block or is instead the third or fourth partial page being programmed in the sub-block. The letters "A", "B", "C", "D" and "E" refer to different values for the bit line settling time parameter (also referred to as bit line settling time adjustment in certain embodiments). The alphabetical position of the letter associated in the table with the bit line settling time parameters corresponds to the duration of the bit line settling time. In one embodiment, a value of "A" for the bit line settling time parameter corresponds to the shortest bit line settling time, followed by "B", etc. In one embodiment, an amount of time assigned to the letter in the table defines the length of time for a bit line settling time parameter.

FIG. 16B is a table 1650 that illustrates how bit line settling times can be managed based on several factors during one embodiment of 2PPP mode. One factor is whether the word line being programmed is less than or equal to "m" or greater than "m." The value of "m" could the same or different as "n" in table 1600. Another factor is the sub-block being programmed. Still another factor is whether this is the first or second partial page being programmed in the sub-block. The letters "E", "F", "G" and "H" refer to different bit line settling times. In one embodiment, "E" is the shortest, followed by "F", etc. In one embodiment, the value for "E" in table 1650 is the same as the value for 'E' in table 1600. Thus, the values for "F", "G" and "H" are all longer than any of the values in table 1600, in one embodiment. However, the value for "E" in table 1650 could be different (e.g., longer or shorter) than the value for "E" in table 1600.

In one embodiment, the order of programming the word lines for partial page programming is reversed relative to the order for full page programming. In one embodiment, full page programming is from the closest word line to the source line sequentially towards the closest word line to the bit line. However, partial page programming is from the closest word line to the bit line sequentially towards the closest word line to the source line. Both full and partial page programming may proceed in accordance with FIG. 7A. Prior to step 772 a programming circuit may apply a voltage to unselected bit lines to pre-charge channels of unselected memory cells to be inhibited from programming. In step 772, the programming circuit may apply a program voltage to the selected word line. Also in step 772, the programming circuit may apply boosting voltages to unselected word lines to inhibit programming of the unselected memory cells. Programming the word lines in the reverse order for partial page programming (relative to full page mode) helps the partial page programming to complete in fewer program loops, in one embodiment.

Figure 17:
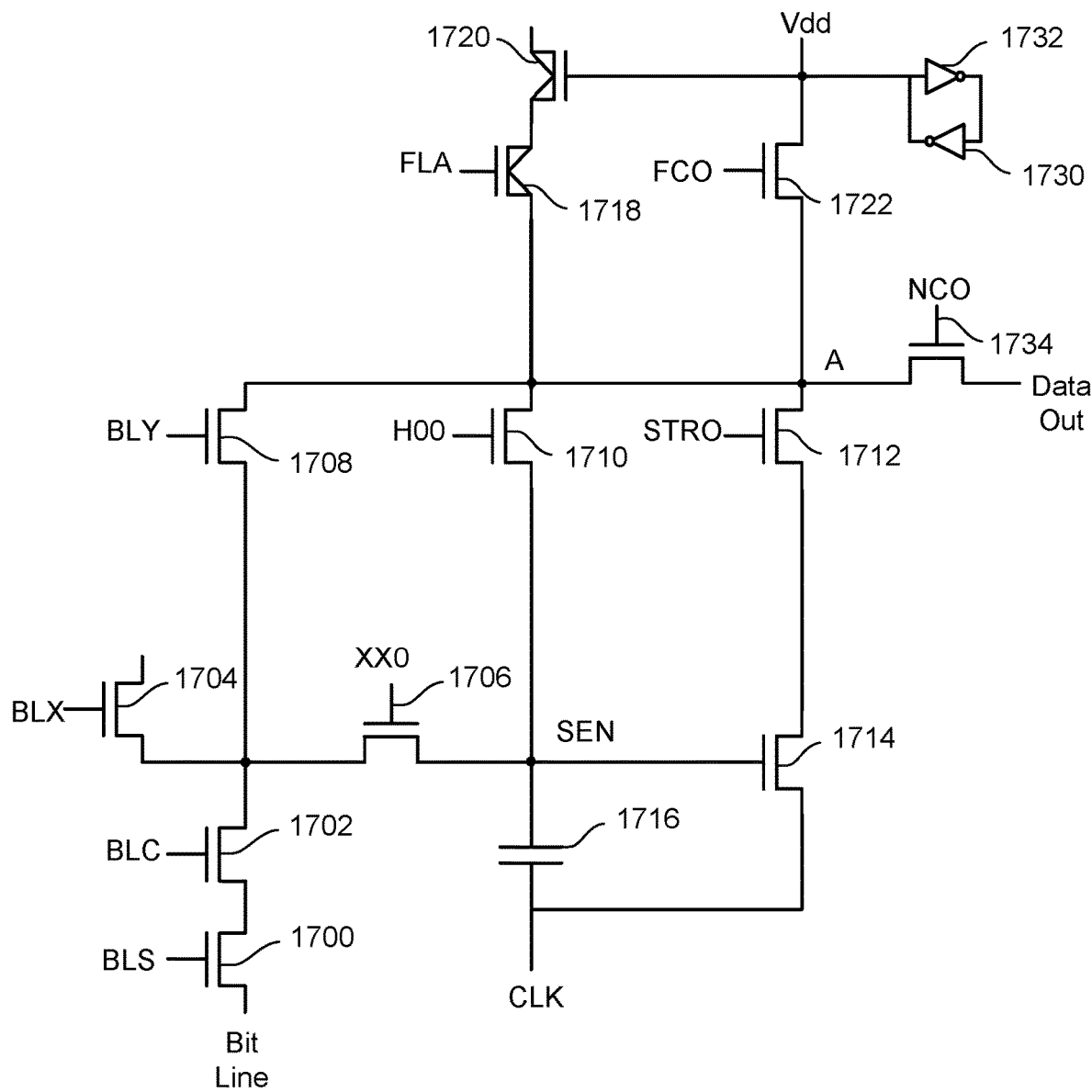
FIG. 17 is a schematic diagram of one embodiment of sense circuitry.

FIG. 17 is a schematic diagram depicting a circuit from sense circuitry 170 (see FIG. 1B). As described below, the circuit of FIG. 17 will pre-charge a capacitor (or other charge storage device) to a pre-charge magnitude, discharge the capacitor through the memory cell for a strobe time, and sense voltage at the capacitor after the strobe time.

Though FIG. 17 features one capacitor, in some embodiments, any suitable charge storage device can replace or complement this capacitor. The sense voltage will be indicative of whether the memory cells conducted the current being sensed for, which is indicative of whether the threshold voltage of the memory cell is greater than or less than threshold voltage being tested for. In some embodiments, the circuit of FIG. 17 can be used for read operations or program verify operation.

FIG. 17 shows transistor 1700 connected to the Bit Line and transistor 1702. Transistor 1700 receives the signal BLS at its gate, and is used to connect to or isolate the Bit Line. Transistor 1702 receives the signal BLC at its gate, and is used as a voltage clamp. The gate voltage BLC is biased at a constant voltage equal to the desired Bit Line voltage plus the threshold voltage of transistor 1702. The function of transistor 1702, therefore, is to maintain a constant Bit Line voltage during a sensing operation (during read or verify), even if the current through the Bit Line changes.

Transistor 1702 is connected to transistors 1704, 1706 and 1708. Transistor 1706 is connected to capacitor 1716. The purpose of transistor 1706 is to connect capacitor 1716 to Bit Line and disconnect capacitor 1716 from Bit Line so that capacitor 1716 is in selective communication with Bit Line. In other words, transistor 1706 regulates the sense depicted between time t8 and t9 of FIG. 9. That is, while transistor 1706 is turned on capacitor 1716 can discharge through the Bit Line, and when transistor 1706 is turned off capacitor 1716 cannot discharge through the Bit Line.

The node at which transistor 1706 connects to capacitor 1716 is also connected to transistor 1710 and transistor 1714. Transistor 1710 is connected to transistors 1708, 1712 and 1718. Transistor 1718 is also connected to transistor 1720. Transistors 1718 and 1720 are PMOS transistors while the other transistors of FIG. 17 are NMOS transistors. Transistors 1710, 1718, and 1720 provide a pre-charging path to capacitor 1716. A voltage (e.g. Vdd or other voltage) is applied to the source of transistor 1720. By appropriately biasing transistors 1710, 1718 and 1720, the voltage applied to the source of transistor 1720 can be used to pre-charge capacitor 1716. After pre-charging, capacitor 1716 can discharge through the Bit Line via transistor 1706 (assuming that transistors 1700 and 1702 are conducting).

The circuit of FIG. 17 includes inverters 1730 and 1732 forming a latch circuit. The output of inverter 1732 is connected to the input of inverter 1730 and the output of inverter 1730 is connected to the input of inverter 1732, as well as transistors 1720 and 1722. The input of inverter 1732 will receive Vdd and the two inverters 1730, 1732 will act as a latch to store Vdd. The input of inverter 1732 can also be connected to another value. Transistors 1712 and 1722 provide a path for communicating the data stored by inverters 1730 and 1732 to transistor 1714. Transistor 1722 receives the signal FCO at its gate. Transistor 1712 receives the signal STRO at its gate. By raising or lowering FCO and STRO, a path is provided or cut off between the inverters 1730, 1732 and transistor (sensing switch) 1714. The gate of transistor 1714 is connected to capacitor 1716, transistor 1706 and transistor 1710 at the node marked SEN. The other end of capacitor 1716 is connected to the signal CLK.

As discussed above, capacitor 1716 is pre-charged via transistors 1710, 1718 and 1720. This will raise the voltage at the node SEN to a pre-charge voltage level (Vpre). When transistor 1706 turns on, capacitor 1716 can discharge its charge through the Bit Line and the selected memory cell if the threshold voltage of the memory cell is below the voltage level being tested for. If the capacitor 1716 is able to discharge, then the voltage at the capacitor (at the SEN node) will decrease.

The pre-charge voltage (Vpre) at the SEN node is greater than the threshold voltage of transistor 1714; therefore, prior to the strobe time, transistor 1714 is on (conducting). Since transistor 1714 is on during the strobe time, then transistor 1712 should be off. If the capacitor does not discharge during the strobe time, then the voltage at the SEN node will remain above the threshold voltage of transistor 1714 and the charge at the inverters 1730, 1732 can be discharged into the CLK signal when STRO turns on transistor 1712. If the capacitor discharges sufficiently during the strobe time, then the voltage at the SEN node will decrease below the threshold voltage of transistor 1714; thereby, turning off transistor 1714 and the data (e.g., Vdd) stored at inverters 1730, 1732 from being discharged through CLK. So testing whether the inverters 1730, 1732 maintain their charge or discharge will indicate the result of the verification process. In one embodiment, the result can be read at node A via transistor 1734 (Data Out) by turning on transistor 1734 gate signal NCO.

The pre-charge level of capacitor 1716 (and, thus, the pre-charge voltage at node SEN) is limited by the current passing through transistor 1710. The current that passes through transistor 1710 is limited by the gate voltage H00. As such, the pre-charge voltage at node SEN is limited by the voltage H00 less the threshold voltage of transistor 1710. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read operation, the voltage applied to the control gate of the cell may cause the channel (connected to the bit line) of the cell to conduct. If this happens, a capacitor is discharged through the channel, lowering in voltage as it discharges.

Figure 18:
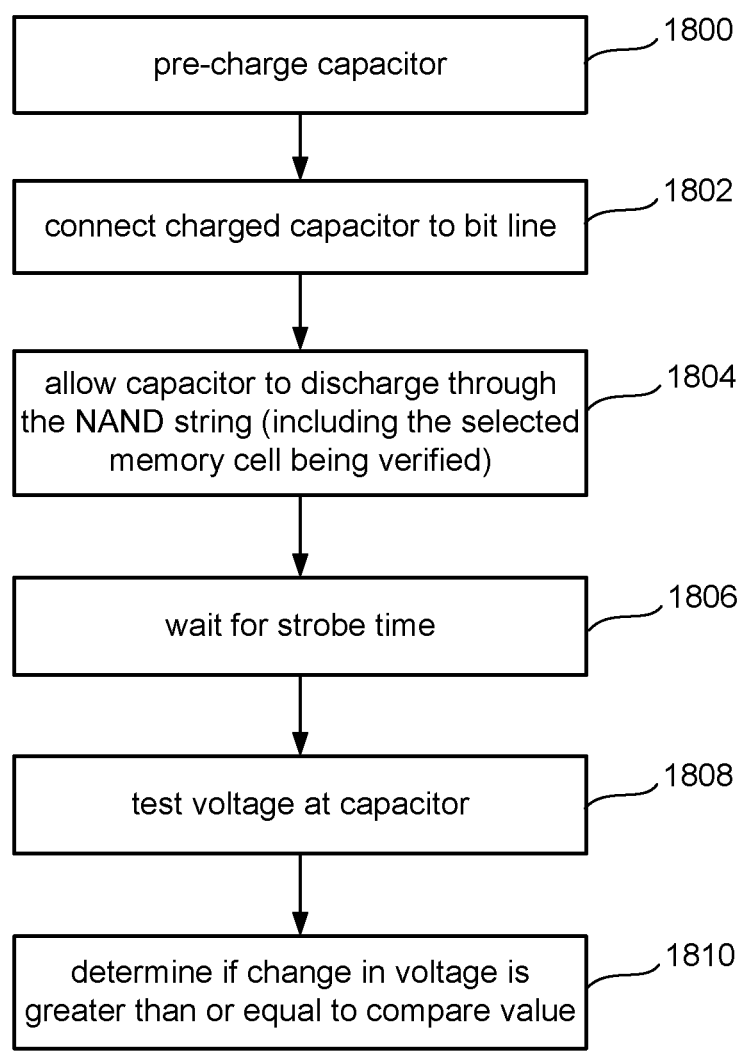
FIG. 18 is a flow chart describing one embodiment of a process for sensing current through a memory cell.

FIG. 18 is a flowchart describing one embodiment for sensing current through the memory cell. The process of FIG. 18 can be executed by the circuit of FIG. 17. The embodiment of FIG. 18 assumes a structure in which a charge storage device will discharge its charge through the selected memory cell in order to detect current. One example of such a structure is depicted at least in part by FIG. 17, as described above. In the example of FIG. 18, the charge storage device comprises a capacitor. However, in other embodiments, other types of charge storage devices can also be used.

In step 1800 of FIG. 18, the capacitor (or other charge storage device) will be pre-charged to a pre-determined voltage level. In step 1802, the pre-charged capacitor (or other charge storage device) will be connected to the bit line. In step 1804, the capacitor will be allowed to discharge its charge through the bit line and NAND string (including the selected memory cell being verified). The system will wait for the strobe time (also referred to as sense time—see FIG. 9 between times t8 and t9) in step 1806. At the conclusion of the strobe time (step 1808), the system will test the voltage across the capacitor. The system will calculate the change in voltage across the capacitor from the pre-charge voltage to the voltage detected in step 18108. In step 1810, this calculated change in voltage is compared to a compare value. If the change in voltage is greater than or equal to the compare value, then it is assumed that the memory cell conducted current greater than the current level being sensed for.

Figure 19:
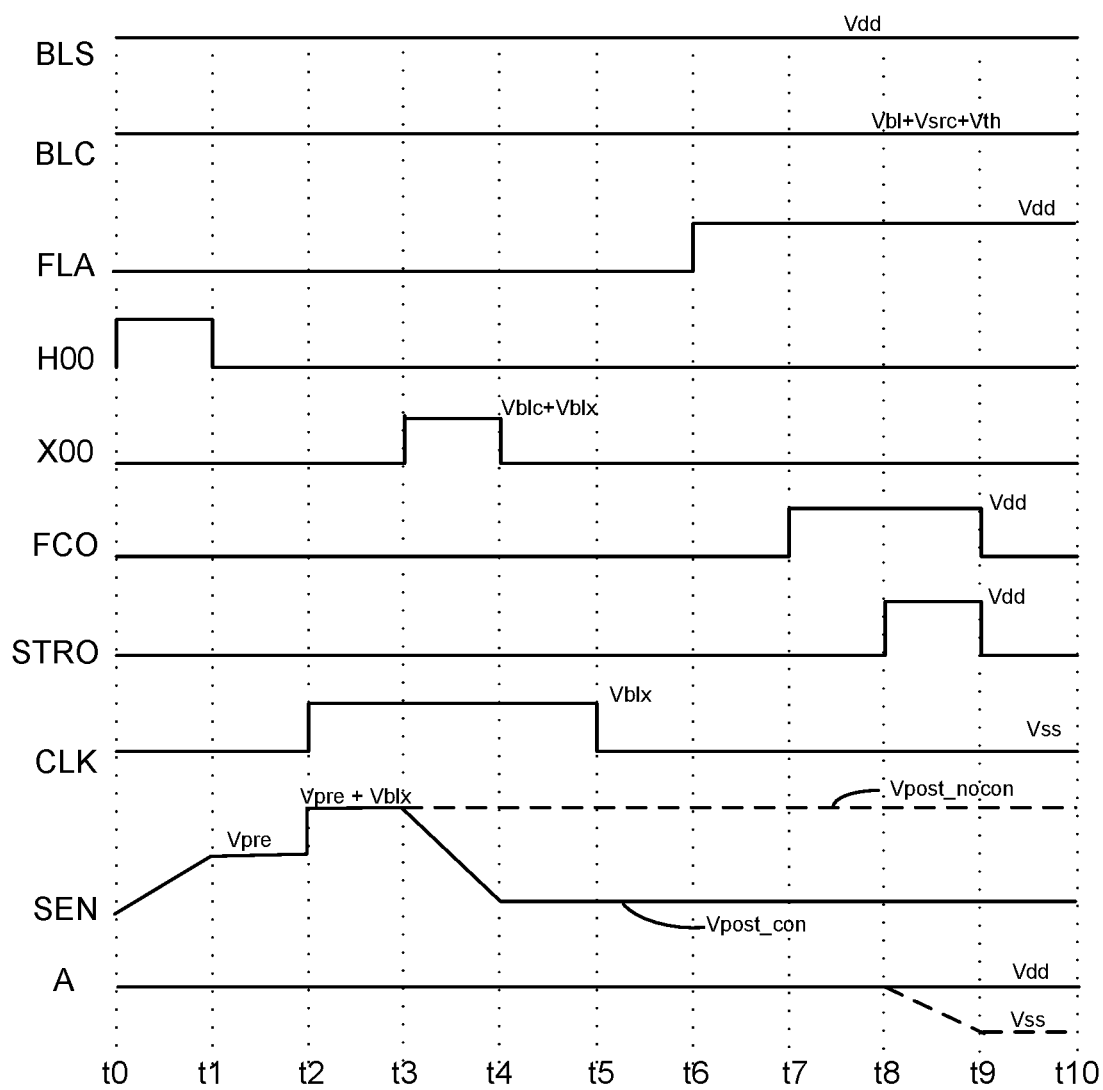
FIG. 19 is a timing diagram that describes the behavior of signals depicted in FIG. 17.

FIG. 19 is a timing diagram describing the behavior of various signals from FIG. 17. Note that the times in FIG. 19 do not correspond to the times in FIG. 9. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 21702. The signal FLA starts at Vss at t0 and goes to Vdd at T6. When the signal FLA is at Vss, the pre-charging path is regulated by transistor 1710. At t0, the voltage of H00 is raised to a pre-charge level. The raising of the voltage at H00 turns on transistor 1710 and opens up the pre-charge path. The magnitude of the voltage at H00 is set. While H00 is high, transistor 1710 turns on and capacitor 1716 will pre-charge between T0 and T1, as depicted by the voltage at SEN (depicted second from the bottom on FIG. 19). At time t1, H00 is brought down to Vss and the pre-charging is completed. Node SEN is at Vpre after the pre-charge is complete. At time t2 the clock (CLK) signal raises to Vblx. Node SEN rises (or couples up) in response to the rise in CLK at time t2. Thus, node SEN rises to Vpre+Vblx at time t2.

The signal X00 is used to allow capacitor 1716 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, capacitor 1716 will be in communication with the Bit Line in order to allow it to discharge as charged through the Bit Line and the selected memory cell (depending on the threshold voltage of the selected memory cell). The signal CLK is raised to Vblx at time t2 and lowered back down to Vss at time T5 to prevent any fighting conditions in the circuit and to allow proper discharge of capacitor 1716.

When X00 is raised up at t3, capacitor 1716 can discharge through the Bit Line (if the threshold voltage is at the appropriate level). As depicted in FIG. 19 between t3 and t4, the voltage at node SEN may discharge. If the threshold voltage for the memory cell being tested is low enough, capacitor 1716 will discharge between t3 and t4. If the threshold voltage for the memory cell being tested is high enough, capacitor 1716 will not discharge and the voltage at the SEN node will not drop between t3 and t4. The period between t3 and t4 is the strobe time. The period between t3 and t4 may also be referred to as an integration time.

FIG. 19 shows that the signal FCO is raised to Vdd at t7 and lowered to Vss at T9. The signal STRO is raised to Vdd at t8 and lowered at t9. Between times t8 and t9, there is a path between the inverters 1730, 1732 and transistor 1714. If the voltage at the node SEN is greater than the threshold voltage of transistor 1714, then there will be a path from the inverters 1730, 1732 to CLK and the data at the inverters 1730, 1732 will dissipate through the signal CLK and through the transistor 1714. If the voltage at the node SEN is lower than threshold voltage of transistor 1714 (e.g. if the capacitor discharged), then transistor 1714 will turn off and the voltage stored by the inverters 1730, 1732 will not dissipate into CLK. FIG. 19 shows the voltage level at A at Vdd. If the voltage of the capacitor does not dissipate (e.g., due to not enough current flowing because the threshold voltage of the selected memory cell is greater than the voltage being tested for), then transistor 1714 will remain on and the voltage at node A will remain dissipate to Vss (as depicted by the dashed line). If the voltage of the capacitor does dissipate (e.g., due to sufficient current flowing because the threshold voltage of the selected memory cell is below the voltage being tested for), then transistor 1714 will turn off and the voltage at node A will remain at Vdd (as depicted by the solid line). The output of node A is provided to the Data Out signal via transistor 1734 by applying Vdd to the signal NCO.

A first embodiment includes an apparatus comprising a plurality of word lines, a plurality of bit lines, non-volatile memory cells, and a sensing circuit. The sensing circuit is configured to sense a first set of the memory cells coupled to a contiguous set of the bit lines and a selected word line using a first bit line settling time. The sensing circuit is configured to sense a second set of the memory cells coupled to a non-contiguous set of the bit lines and the selected word line using a second bit line settling time.

In a second embodiment, in furtherance of the first embodiment, the second bit line settling time is longer than the first bit line settling time.

In a third embodiment, in furtherance of either the first or second embodiments, the second set of the memory cells are coupled to alternating bit lines.

In a fourth embodiment, in furtherance of any of the first to third embodiments, the sensing circuit is further configured to establish the second bit line settling time based on a mode of a plurality of partial page programming modes that the sensing circuit is verifying.

In a fifth embodiment, in furtherance of any of the first to fourth embodiments, the sensing circuit is further configured to establish a longer second bit line settling time in response to a sensing operation for which the non-contiguous set comprises alternating bit lines for at least half of the bit lines of the non-contiguous set coupled to the selected word line.

In a sixth embodiment, in furtherance of any of the first to fifth embodiments, the sensing circuit is further configured to establish the second bit line settling time based on a specific partial page of a plurality of partial pages that the sensing circuit is verifying on the selected word line.

In a seventh embodiment, in furtherance of any of the first to sixth embodiments, the sensing circuit is further configured to establish the second bit line settling time based on physical location of the selected word line.

In an eighth embodiment, in furtherance of any of the first to seventh embodiments, the sensing circuit is further configured to establish the second bit line settling time based on when the selected word line is programmed in a sequence that programs the plurality of word lines.

In a ninth embodiment, in furtherance of any of the first to eighth embodiments, the non-volatile memory cells comprise strings of memory cells that extend from one of the bit lines to a source line and each the plurality of word lines connects to one memory cell on each of the strings. The apparatus further comprises a programming circuit configured to program the word lines in a sequential order along the strings from the bit lines to the source line, comprising apply a voltage to unselected bit lines to pre-charge channels of unselected memory cells to be inhibited from programming; apply a program voltage to the selected word line; and apply boosting voltages to unselected word lines after pre-charging the channels to inhibit programming of the unselected memory cells.

In a tenth embodiment, in furtherance of any of the ninth embodiment, the programming circuit is configured to program the memory cells in a single level cell (SLC) partial page mode when programming the word lines in the sequential order from the bit lines to the source line.

In an eleventh embodiment, in furtherance of any of the first to tenth embodiments, the sensing circuit is further configured to establish the second bit line settling time for a read operation executed based on a reading mode of a plurality of partial page reading modes.

A further embodiment includes a method comprising applying one or more programming pulses to a full page of non-volatile memory cells coupled to a first set of bit lines. The method further comprises verifying programming of the full page of non-volatile memory cells using a first bit line settling time parameter value. The method further comprises applying one or more programming pulses to a partial page of non-volatile memory cells coupled to a second set of bit lines. The method further comprises verifying programming of the partial page of non-volatile memory cells using a second bit line settling time parameter value.

A further embodiment includes a non-volatile storage device comprising: a memory array of memory cells; a plurality of bit lines; a plurality of word lines; and one or more control circuits. The one or more control circuits are configured to program a set of the memory cells in accordance with a program operation of one of a plurality of programming modes. The one or more control circuits are configured to apply voltages to selected bit lines during a verify operation of the program operation. The one or more control circuits are configured to manage a length of time between applying the voltages to the selected bit lines and sensing conditions of the set of memory cells during the verify operation based on the programming mode.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a plurality of word lines;
a plurality of bit lines;
non-volatile memory cells; and
a sensing circuit configured to:
  sense a first set of the memory cells coupled to a contiguous set of the bit lines and a selected word line using a first bit line settling time; and
  sense a second set of the memory cells coupled to a non-contiguous set of the bit lines and the selected word line using a second bit line settling time.

2. The apparatus of claim 1, wherein the second bit line settling time is longer than the first bit line settling time.

3. The apparatus of claim 1, wherein the second set of the memory cells are coupled to alternating bit lines.

4. The apparatus of claim 1, wherein the sensing circuit is further configured to:
  establish the second bit line settling time based on a mode of a plurality of partial page programming modes that the sensing circuit is verifying.

5. The apparatus of claim 1, wherein the sensing circuit is further configured to:
  establish a longer second bit line settling time in response to a sensing operation for which the non-contiguous set comprises alternating bit lines for at least half of the bit lines associated with the selected word line.

6. The apparatus of claim 1, wherein the sensing circuit is further configured to:
  establish the second bit line settling time based on a specific partial page of a plurality of partial pages that the sensing circuit is verifying on the selected word line.

7. The apparatus of claim 1, wherein the sensing circuit is further configured to:
  establish the second bit line settling time based on physical location of the selected word line.

8. The apparatus of claim 1, wherein the sensing circuit is further configured to:
  establish the second bit line settling time based on when the selected word line is programmed in a sequence that programs the plurality of word lines.

9. The apparatus of claim 1, wherein the non-volatile memory cells comprise strings of memory cells that extend from one of the bit lines to a source line and each the plurality of word lines connects to one memory cell on each of the strings, and further comprising:
  a programming circuit configured to program the word lines in a sequential order along the strings from the bit lines to the source line, comprising:
    apply a voltage to unselected bit lines to pre-charge channels of unselected memory cells to be inhibited from programming;
    apply a program voltage to the selected word line; and
    apply boosting voltages to unselected word lines after pre-charging the channels to inhibit programming of the unselected memory cells.

10. The apparatus of claim 9, wherein the programming circuit is configured to program the memory cells in a single level cell (SLC) partial page mode when programming the word lines in the sequential order from the bit lines to the source line.

11. The apparatus of claim 1, wherein the sensing circuit is further configured to establish the second bit line settling time for a read operation executed based on a reading mode of a plurality of partial page reading modes.

12. A method comprising:
  applying one or more programming pulses to a full page of non-volatile memory cells coupled to a first set of bit lines;
  verifying programming of the full page of non-volatile memory cells using a first bit line settling time parameter value;
  applying one or more programming pulses to a partial page of non-volatile memory cells coupled to a second set of bit lines; and
  verifying programming of the partial page of non-volatile memory cells using a second bit line settling time parameter value.

13. The method of claim 12, wherein the second bit line settling time parameter value causes a longer bit line settling time than the first bit line settling time parameter value.

14. The method of claim 12, wherein:
  the first set of bit lines comprises a contiguous set of bit lines; and
  the second set of bit lines comprises a non-contiguous set of bit lines.

15. A non-volatile storage device comprising:
  a memory array of memory cells;
  a plurality of bit lines;
  a plurality of word lines; and
  one or more control circuits configured to:
    program a set of the memory cells in accordance with a program operation of one of a plurality of programming modes;
    apply voltages to selected bit lines during a verify operation of the program operation; and
    manage a length of time between applying the voltages to the selected bit lines and sensing conditions of the set of memory cells during the verify operation based on the programming mode.

16. The non-volatile storage device of claim 15, wherein the one or more control circuits are configured to:
  enforce a longer time between first applying the voltages to the selected bit lines and sensing conditions of the set of memory cells when the program mode is a partial page programming mode than a full page programming mode.

17. The non-volatile storage device of claim 15, wherein the one or more control circuits are configured to:
  enforce a longer time between first applying the voltages to the selected bit lines and sensing conditions of the set of memory cells when the program mode is a first partial page programming mode having a first partial page size than a second partial page programming mode having a second partial page size that is smaller than the first partial page size.

18. The non-volatile storage device of claim 15, wherein the one or more control circuits are configured to:
  enforce a longer time between first applying the voltages to the selected bit lines and sensing conditions of the set of memory cells when the program mode programs memory cells associated with a non-contiguous set of the bit lines than when the program mode programs memory cells associated with a contiguous set of the bit lines.

19. The non-volatile storage device of claim 15, wherein the one or more control circuits are configured to:
  increase the time between first applying the voltages to the selected bit lines and sensing conditions of the set of memory cells for a subsequent verify operation in response to the set of memory cells failing to pass the verify operation.

20. The non-volatile storage device of claim 15, wherein the one or more control circuits are further configured to:
  manage the length of time between first applying the voltages to the selected bit lines and sensing conditions of the set of memory cells during the verify operation based on which sub-block of a block of memory cells is being programmed.

* * * * *